(12) United States Patent
Rogers

(10) Patent No.: US 9,093,975 B2
(45) Date of Patent: Jul. 28, 2015

(54) MICROELECTROMECHANICAL SYSTEMS COMPRISING DIFFERENTIAL INDUCTORS AND METHODS FOR MAKING THE SAME

(71) Applicant: HARRIS CORPORATION, Melbourne, FL (US)

(72) Inventor: John E. Rogers, Gainesville, FL (US)

(73) Assignee: Harris Corporation, Melbourne, FL (US)

( * ) Notice: Subject to any disclaimer, the term of this patent is extended or adjusted under 35 U.S.C. 154(b) by 26 days.

(21) Appl. No.: 13/969,916

(22) Filed: Aug. 19, 2013

(65) Prior Publication Data

US 2015/0048901 A1 Feb. 19, 2015

(51) Int. Cl.
| H03H 7/01 | (2006.01) |
| H03H 1/02 | (2006.01) |
| H03H 3/00 | (2006.01) |
| H01F 17/00 | (2006.01) |
| H01L 23/522 | (2006.01) |
| H01L 23/66 | (2006.01) |
| H03H 7/00 | (2006.01) |

(52) U.S. Cl.
CPC .............. *H03H 1/02* (2013.01); *H01F 17/0006* (2013.01); *H01L 23/5227* (2013.01); *H01L 23/66* (2013.01); *H03H 3/00* (2013.01); *H03H 7/0115* (2013.01); *H03H 2007/006* (2013.01)

(58) Field of Classification Search
USPC .................................................. 333/175, 197
See application file for complete search history.

(56) References Cited

U.S. PATENT DOCUMENTS

| 5,536,988 | A | 7/1996 | Zhang et al. |
| 5,959,516 | A | 9/1999 | Chang et al. |
| 6,127,767 | A | 10/2000 | Lee et al. |
| 6,133,670 | A | 10/2000 | Rodgers et al. |
| 6,310,526 | B1 | 10/2001 | Yip et al. |
| 6,360,033 | B1 | 3/2002 | Lee et al. |
| 6,497,141 | B1 | 12/2002 | Turner et al. |
| 6,611,168 | B1 | 8/2003 | Denison et al. |
| 6,621,390 | B2 | 9/2003 | Song et al. |

(Continued)

FOREIGN PATENT DOCUMENTS

| EP | 1760731 | 3/2007 |
| EP | 1 785 391 A2 | 5/2007 |

(Continued)

OTHER PUBLICATIONS

International Search Report and Written Opinion issued Nov. 18, 2014, in Application No. PCT/US2014/049668.

(Continued)

*Primary Examiner* — Adam Houston
(74) *Attorney, Agent, or Firm* — Robert J. Sacco, Esq.; Fox Rothschild LLP

(57) ABSTRACT

An integrated Microelectromechanical Systems ("MEMS") device (100). The MEMS device comprises a substrate (200, 300), a transition portion (118), and a differential inductor (1000, 1100, 1300). The transition portion is connected to and at least partially extends transversely away from a major surface of the substrate. The differential inductor is mechanically suspended above a major surface of the substrate at least partially by the transition portion. The differential inductor is also electrically connected to an electronic circuit external thereto by the transition portion. A first dielectric gap exists between the major surface of the substrate and the differential inductor.

28 Claims, 19 Drawing Sheets

(56) References Cited

U.S. PATENT DOCUMENTS

| | | | |
|---|---|---|---|
| 6,661,069 B1 | 12/2003 | Chinthakindi et al. | |
| 6,853,534 B2 | 2/2005 | Williams | |
| 6,975,193 B2 | 12/2005 | Knieser et al. | |
| 7,012,489 B2 | 3/2006 | Sherrer et al. | |
| 7,091,647 B2 | 8/2006 | Jerman | |
| 7,148,772 B2 | 12/2006 | Sherrer et al. | |
| 7,251,466 B2 | 7/2007 | Porret et al. | |
| 7,304,556 B2 | 12/2007 | Tamura et al. | |
| 7,598,836 B2 | 10/2009 | Lee | |
| 7,732,975 B1 | 6/2010 | Hobbs et al. | |
| 7,755,174 B2 | 7/2010 | Rollin et al. | |
| 7,898,356 B2 | 3/2011 | Sherrer et al. | |
| 7,933,112 B2 | 4/2011 | Ayazi et al. | |
| 7,977,136 B2 | 7/2011 | Ayazi et al. | |
| 8,039,922 B2 | 10/2011 | Ni | |
| 8,276,259 B1 | 10/2012 | Findley et al. | |
| 8,373,522 B2 | 2/2013 | Rogers | |
| 8,860,114 B2* | 10/2014 | Yen et al. | 257/306 |
| 8,900,994 B2* | 12/2014 | Yu et al. | 438/667 |
| 2001/0001550 A1 | 5/2001 | Bryzek et al. | |
| 2002/0130586 A1 | 9/2002 | Mao et al. | |
| 2003/0020561 A1 | 1/2003 | Qiu et al. | |
| 2003/0102936 A1 | 6/2003 | Schaefer | |
| 2003/0155221 A1 | 8/2003 | Kawai | |
| 2003/0184413 A1 | 10/2003 | Nguyen | |
| 2004/0189142 A1 | 9/2004 | Knieser et al. | |
| 2005/0073380 A1 | 4/2005 | Howell et al. | |
| 2005/0088255 A1 | 4/2005 | Sengupta et al. | |
| 2005/0264384 A1 | 12/2005 | Simon et al. | |
| 2006/0003482 A1 | 1/2006 | Chinthakindi et al. | |
| 2006/0087390 A1 | 4/2006 | Yuba et al. | |
| 2006/0238279 A1 | 10/2006 | Lu et al. | |
| 2006/0261702 A1 | 11/2006 | Harada et al. | |
| 2008/0157627 A1 | 7/2008 | Kato et al. | |
| 2009/0058569 A1 | 3/2009 | Sherrer et al. | |
| 2009/0114513 A1 | 5/2009 | Kim et al. | |
| 2010/0091372 A1 | 4/2010 | Yamanoi et al. | |
| 2011/0102105 A1 | 5/2011 | Rogers | |
| 2011/0188168 A1* | 8/2011 | Rogers | 361/281 |
| 2011/0198202 A1 | 8/2011 | Rogers | |
| 2011/0204969 A1* | 8/2011 | Chen et al. | 327/581 |
| 2013/0194770 A1 | 8/2013 | Bernstein et al. | |
| 2013/0285171 A1 | 10/2013 | Najafi et al. | |
| 2013/0328140 A1 | 12/2013 | Potasek et al. | |
| 2015/0048901 A1* | 2/2015 | Rogers | 333/175 |
| 2015/0048902 A1* | 2/2015 | Rogers | 333/186 |
| 2015/0048903 A1* | 2/2015 | Rogers | 333/186 |

FOREIGN PATENT DOCUMENTS

| | | |
|---|---|---|
| EP | 1973190 | 9/2008 |
| WO | 0007218 | 2/2000 |
| WO | 02/080279 | 10/2002 |
| WO | 2008/123525 A1 | 10/2008 |
| WO | 2010054889 A1 | 5/2010 |
| WO | 2011053888 | 5/2011 |
| WO | 2011097093 | 8/2011 |

OTHER PUBLICATIONS

Leblond, H. et al., "On-Chip Spiral Inductors and Metal-Air-Metal Capacitors in Suspended Technology," 2006 European Microwave Conference, Sep. 1, 2006, pp. 44-47.

Huang, T. et al., "5-GHz Low Phase-Noise CMOS VCO Integrated with a Micromachined Switchable Differential Inductor," IEEE Microwave and Wireless Components Letters, IEEE Service Center, New York, NY, US, vol. 18, No. 5, May 1, 2008, pp. 338-340.

Bunch, R.L. et al., "Quality Factor and Inductance in Differential IC Implementations," IEEE Microwave Magazine, vol. 3, No. 2, Jun. 1, 2002, pp. 82-92.

Information about Related Patents and Patent Applications, see section 6 of the accompanying Information Disclosure Statement Letter, which concerns Related Patents and Patent Applications. (Jan. 28, 2015).

International Search Report and Written Opinion mailed Nov. 18, 2014, in Application PCT/US2014/049667.

International Search Report and Written Opinion mailed Oct. 31, 2014, in Application PCT/US2014/049664.

Legtenberg, R. et al., "Comb-Driven actuators for Large Displacement," J. of Micromechanics and Microengineering, vol. 6, pp. 320-329.

Tas N.R., et al.: "Technical Note; Design, Fabrication and Test of Laterally Driven Electrostatic Motors Employing Walking Motion and Mechanical Leverage" Journal of Micromechanics & Microengineering, Institute of Physics Publishing, Bristol, GB, vol. 13, No. 1, Jan. 1, 2003, pp. N6-N15, XP020068883.

Rogers, John E., et al.: "Bi-Directional Gap Closing MEMS Actuator Using Timing and Control Techniques", IEEE Industrial Electronics, IECON 2006—32nd Annual Conference on, IEEE, Piscataway, NJ, USA, Nov. 1, 2006, pp. 3149-3154, XP031077518.

Harris Corporation, International Search Report dated Mar. 16, 2011; Application Serial No. PCT/US2010/054889.

International Search Report mailed Oct. 7, 2011 in Application Serial No. PCT/US2011/022483 in the name of Harris Corporation.

Information about Related Patents and Patent Applications, see section 6 of the accompanying Information Disclosure Statement Letter, which concerns Related Patents and Patent Applications. Mar. 10, 2014.

International Search Report mailed Mar. 5, 2012; Application Serial No. PCT/US2011/023321, in the name of Harris Corporation.

Yalcinkaya, A.D., "Low Voltage High-Q SOI MEMS Varactors fro RF Applications"; 2003 IEEE Proceedings of the 29th European Solid-State Circuits Conference, ESSCIRC '03, Sep. 16-18, 2003, pp. 607-610, with one IEEE Xplore abstract page.

Fedder, G.K., "Tunable RF and Analog Circuits Using on-Chip MEMS Passive Components"; 2005 IEEE International Solid-State Circuits Conference, ISSCC 2005, Feb. 9, 2005, Digest of Technical Papers, pp. 390-391.

* cited by examiner

Pi-Type Band Pass Filter

T-Type Band Pass Filter

MICROELECTROMECHANICAL SYSTEMS COMPRISING DIFFERENTIAL INDUCTORS AND METHODS FOR MAKING THE SAME

BACKGROUND OF THE INVENTION

1. Statement of the Technical Field

The inventive arrangements relate to Microelectromechanical System ("MEMS") and methods for forming the same, and more specifically to differential inductors for MEMS devices.

2. Description of the Related Art

MEMS is a technology of very small devices typically between 2 micrometers to 2 millimeters in size. The MEMS devices can include one or more components between 1 to 100 micrometers in size. Conventional MEMS devices are fabricated using molding techniques, plating techniques, wet etching techniques, and/or dry etching techniques. Various materials can be used to create the MEMS devices. Such materials include silicon, polymers, metals and ceramics.

Radio Frequency ("RF") filters typically occupy a relatively large amount of space in an RF system (i.e., >25%). As such, it has been desirable to miniaturize RF filters via MEMS technology. RF filters may comprise varactor devices, such as Gap Closing Actuator ("GCA") varactors. GCA varactors generally operate on the principle of electrostatic attraction between adjacent interdigitating fingers of a drive comb structure and a movable truss comb structure. That is, motion of the truss comb structure can be generated by developing a voltage difference between the drive comb structure and the truss comb structure. The voltages applied at comb structures are also seen at the interdigitating fingers, respectively. The resulting voltage difference generates an attractive force between the interdigitating fingers. If the generated electrostatic force between the fingers is sufficiently large to overcome the other forces operating on truss comb structure (such as a spring constant of a resilient component), the electrostatic force will cause the motion of the truss comb structure between a first interdigitated position (resting position at a zero voltage difference) and a second interdigitated position (position at a non-zero voltage difference) among a motion axis. Once the voltage difference is reduced to zero, a resilient component (e.g., a spring) restores the position of the truss comb structure to the first interdigitating position.

RF filters typically comprise RF inductors built using thin films disposed on the substrate (e.g., Silicon or Silicon Germanium). Such RF inductors are typically limited in their performance which is proportional to their Quality ("Q") factor. The limited performance of the RF inductors is a consequence of parasitic effects and dielectric losses from the substrate and is a function of frequency. As the frequency increases, more loss results due to coupling of the electric field through the substrate, instead of between the windings of the RF inductor.

SUMMARY OF THE INVENTION

The present invention concerns systems and methods for making an integrated MEMS device. The MEMS device comprises a substrate, one or more capacitive elements (such as a varactor), and one or more differential inductor elements. A transition portion is connected to and at least partially extends transversely away from a major surface of the substrate. The differential inductor is mechanically suspended above a major surface of the substrate at least partially by the transition portion. The differential inductor is also electrically connected to an electronic circuit external thereto by the transition portion. A first dielectric gap exists between the major surface of the substrate and the differential inductor. The first dielectric gap can include, but is not limited to, air or other dielectric fluid. A magnetic material may be disposed between coil windings of the differential inductor.

In some scenarios, the electronic circuit is formed on the major surface of the substrate so as to reside between the substrate and the differential inductor, wherein a dielectric gap exists between the electronic circuit and the differential inductor. In this case, a first conductive material used to fabricate the differential inductor has a first melting point that is different from second melting points of all second conductive materials used to form the electronic circuit by no more than 100° C.

The transition portion may comprise a three dimensional hollow ground structure in which an elongated center conductor is suspended. The elongated center conductor is separated from the three dimensional hollow ground structure via a dielectric gap on all sides. A first inductor port of the differential inductor is electrically connected to the three dimensional hollow ground structure of the transition portion. A second inductor port of the differential inductor is electrically connected to the elongated center conductor of the transition portion. Alternatively, both of the first and second inductor ports are electrically connected to the elongated center conductor of the transition portion. A periphery of the differential inductor may be separated from and at least partially surrounded by a ground structure of the transition portion. In this case, a magnetic material may be disposed between the differential inductor and the ground structure of the transition portion.

The differential inductor may comprise a first coil portion defined by windings traveling along a first serpentine path in a direction towards a center of the differential inductor and a second coil portion defined by windings traveling along a serpentine path in a direction away from the center of the differential inductor. The first coil portion and the second coil portion can be electrically connected to each other at the center of the differential inductor. At least a portion of each winding of the second coil portion is disposed between two adjacent windings of the second coil portion. In some scenarios, a first winding portion of the first coil portion may overlap a second winding portion of the second coil portion such that a dielectric gap exists between the first and second winding portions.

BRIEF DESCRIPTION OF THE DRAWINGS

Embodiments will be described with reference to the following drawing figures, in which like numerals represent like items throughout the figures, and in which.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Figure 14:
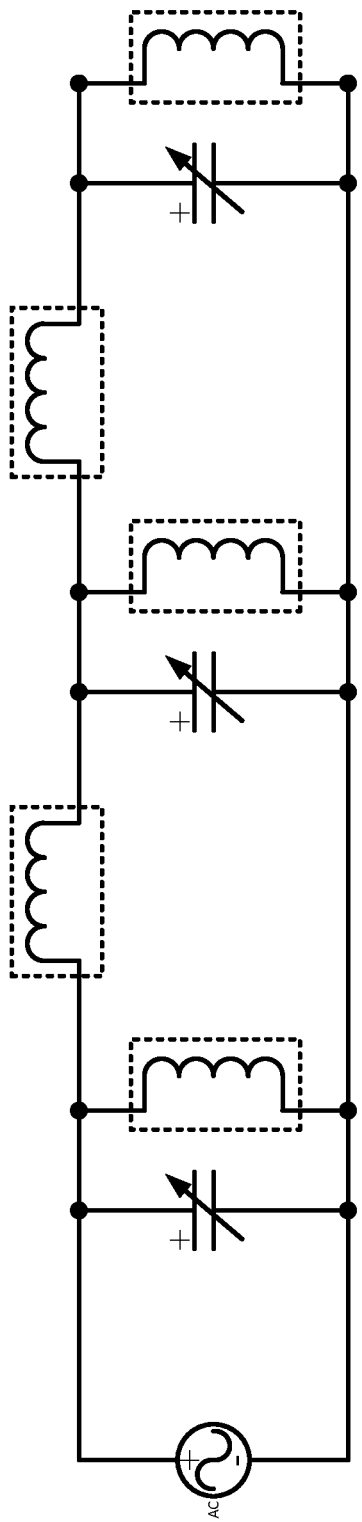
FIG. 14 is a schematic illustration of an exemplary Pi-type band pass filter.
Figure 15:
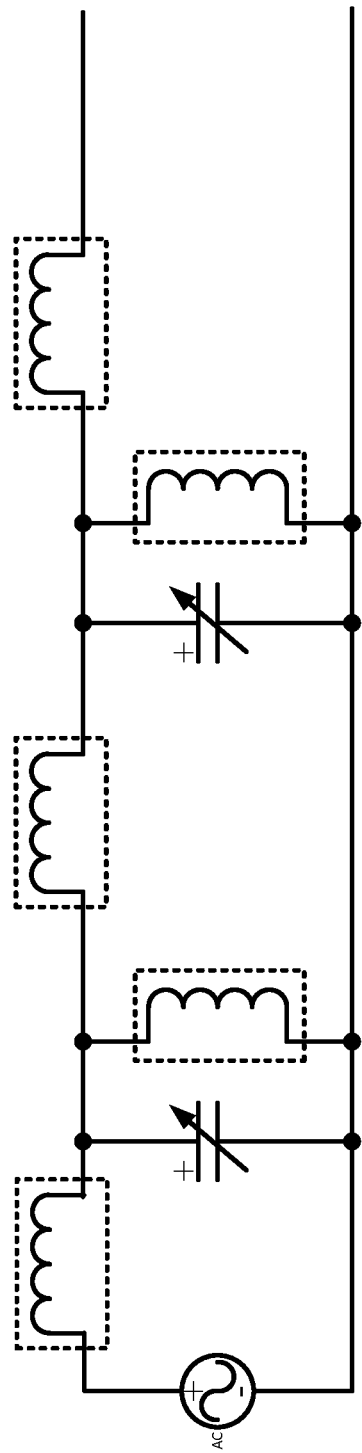
FIG. 15 is a schematic illustration of an exemplary T-type band pass filter.

The present invention generally concerns MEMS devices which are integrated with ICs. The MEMS devices can be used in a variety of applications. Such applications include, but are not limited to, multi-band communication system applications, radar applications, wide-band tracking receiver applications, broadcast radio applications, television applications, wireless communication device applications (e.g., cell-phone applications), Ultra-WideBand ("UWB") communication applications, SATellite COMmunication ("SATCOM") applications, Software Defined Radio ("SDR") applications, microwave/mm-wave communication applications, military/space system applications, and/or telecommunication applications. The MEMS devices include, but are not limited to, varactors, inductors, and/or RF filters. As should be understood, RF filters are generally configured to combine and/or separate multiple frequency bands. Exemplary circuit architectures for such RF filters are shown in FIGS. 14 and 15.

The present invention will be described below in relation to exemplary RF filters. The present invention is not limited in this regard. Each of the electronic components of the RF filters (e.g., varactors and inductors) can be used independently or with other MEMS devices in accordance with particular applications.

Figure 1:
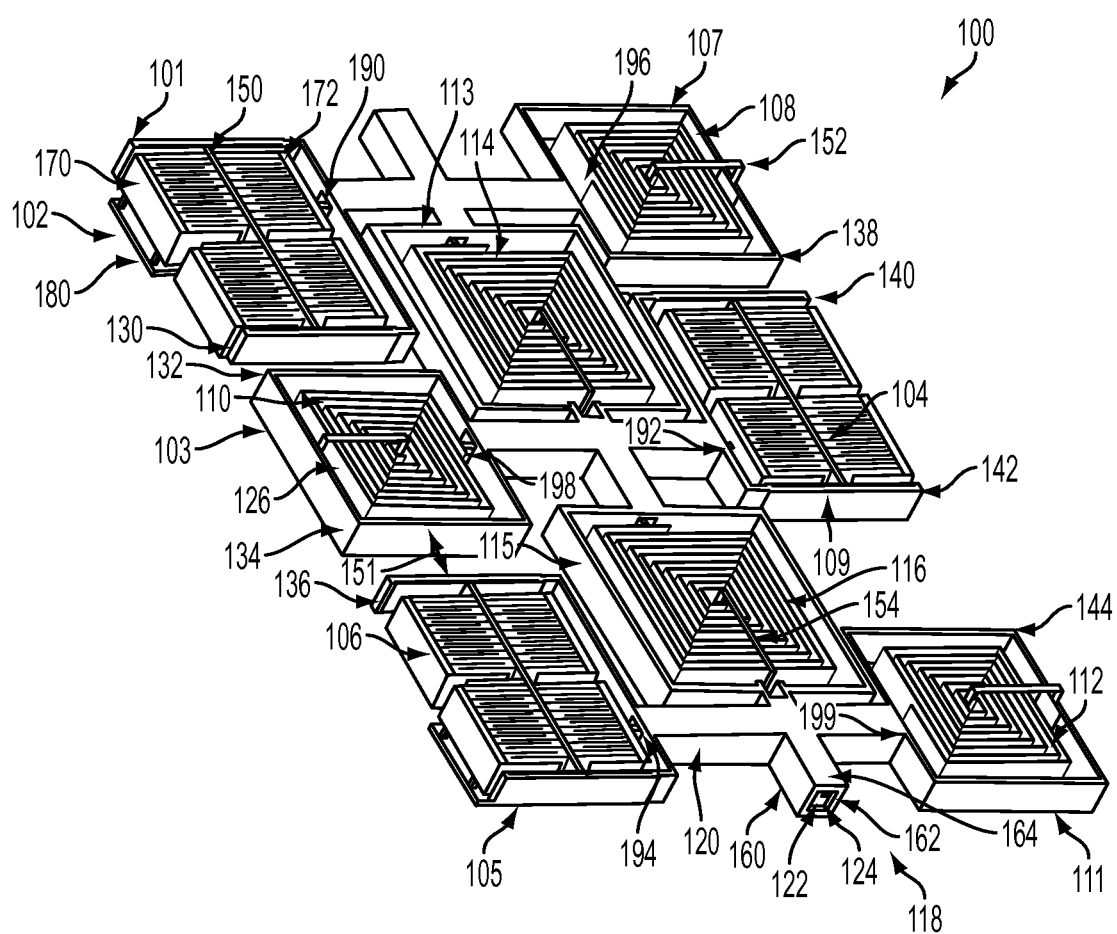
FIG. 1 is a top perspective view of an exemplary MEMS RF filter that is useful for understanding the present invention.

A schematic illustration of an exemplary RF filter 100 is provided in FIG. 1. In some scenarios, the RF filter 100 comprises a 3-pole tunable bandpass filter designed to select a desired band of frequencies for a particular frequency range (e.g., the 1060-1370 MHz range). Embodiments of the present invention are not limited to 3-pole tunable bandpass filter architectures. The RF filter 100 can include any type of filter architecture suitable for a particular application, or have as few or as many poles as necessary for bandwidth. Notably, the tunable feature of the RF filter 100 offers significant size reduction over switch-type RF bandpass filter banks.

As shown in FIG. 1, the RF filter 100 is implemented using three shunt varactors 102, 104, 106, three shunt inductors 108, 110, 112, two series inductors 114, 116, and a transition portion 118 (e.g., a transmission line). Each of the listed components 102-116 can be fabricated using at least one conductive material, such as metal (e.g., gold, nickel, aluminum, copper, chromium, titanium, tungsten, platinum, and/or silver). The operation of inductors are well known in the art, and therefore will not be described in detail herein. Notably, the inductors are not limited to the architecture shown in FIG. 1. Accordingly, the inductors can have alternative designs, such as a differential inductor design as discussed below in relation to FIGS. 10-13. As will also be described below, in some scenarios, the RF filter 100 exhibits a 1.9 dB insertion loss across a 300 MHz bandwidth. This is a significant insertion loss improvement over conventional RF filter designs, such as those described above in the background section of the document.

The transition portion 118 is configured to electrically connect the RF filter 100 to external circuitry. Accordingly, the transition portion 118 comprises a ground structure 120 and a center conductor 122. The center conductor 122 is electrically connected to the shunt varactors 102, 104, 106 at points 190, 192, 194, inductors 108, 110, 112 at ends 196, 198, 199, and inductors 114, 116 at their outer ends and center ends. Pass-over conductive structures 154 are provided to facilitate the electrical coupling of the center conductor 122 to the center ends of the inductors 114, 116. Similarly, the ground structure 120 is electrically connected to the shunt varactors 102, 104, 106 via grounding portions 150 and inductors 108, 110, 112 via pass-over grounding portions 152.

Operations of the shunt varactors 102, 104, 106 will be described below in relation to FIGS. 4-5. Still, it should be understood that each shunt varactor 102, 104, 106 comprises interdigitated drive comb structures and a truss comb structure. A voltage (e.g., 90 Volts) is applied to the drive comb structures via the center conductor 122 such that a gap between each drive comb structure and the truss comb structure is varied. For example, in some scenarios, the gap between respective comb structures is varied between 20 microns down to 5 microns. Notably, the drive comb structures 170, 172 of each shunt varactor 102, 104, 106 are electrically connected to each other via a respective coupling structure 180.

As shown in FIG. 1, the ground structure 120 comprises a plurality of straight portions defined by a three dimensional hollow structure with a generally rectangular cross-sectional profile. Notably, the three dimensional hollow structure can have a cross-sectional profile other than a rectangular cross-sectional profile. The center conductor 122 is disposed within the three dimensional hollow structure. In some scenarios, the center conductor 122 is suspended therein so as to extend along a center axis of each straight portion of the ground structure 120. Accordingly, the center conductor 122 is encompassed by the ground structure 120 along at least a portion of its length and separated from the ground structure 120 via a dielectric gap 124 on all sides thereof. The dielectric gap 124 can comprise, but is not limited to, air or other dielectric fluid. The center conductor 122 and ground structure 120 are fabricated using at least one conductive material, such as metal (e.g., gold, nickel, aluminum, copper, chromium, titanium, tungsten, platinum, and/or silver).

In some scenarios, the center conductor 122 is suspended within the ground structure 120 via one or more dielectric straps (not shown in FIG. 1) connected between opposing sidewalls of the ground structure 120. For example, a dielectric strap can be connected between sidewalls 160, 162 of the ground structure 120 so as to mechanically support and/or suspend at least a portion of the center conductor 122 disposed within section 164 of the ground structure 120. In some scenarios, a plurality of dielectric straps is disposed along the entire length of each straight portion of the ground structure 120.

The ground structure 120 also comprises isolation portions 101, 103, 105, 107, 109, 111, 113, 115 each defined by a plurality of sidewalls (e.g., two, three or four sidewalls). Each isolation portion 101, 103, 105, 107, 109, 111, 113, 115 at least partially surrounds a respective component 102, 104, 106, 108, 110, 112, 114, 116 so as to electrically isolate the same from other adjacent components. For example, as shown in FIG. 1, the ground structure 120 surrounds four sidewalls of each inductor 108-116. The ground structure 120 also surrounds three sidewalls of each shunt varactor 102-106. Embodiments of the present invention are not limited in this regard. Alternatively, the ground structure 120 can surround one or more sidewalls of one or more inductors 108-116 and/or shunt varactors 102-106.

In some scenarios, a space 151 is provided between adjacent sidewalls 130/132, 134/136, 138/140, 142/144 of the ground structure 120. Notably, the space 151 has dimensions selected for ensuring that adjacent electronic components are placed in close proximity to each other. For example, in some scenarios, the adjacent sidewalls 130/132, 134/136, 138/140, 142/144 are spaced 0.1-1.0 mm from each other. In other scenarios, no space 151 is provided between adjacent sidewalls 130/132, 134/136, 138/140, 142/144. Alternatively a single sidewall of the ground structure 120 (or a "common sidewall") is used to separate two adjacent components 102/110, 102/114, 104/112, 104/114, 104/116, 106/116, 108/104, 108/114, 110/106, 110/114, 110/116, 112/116. In this case, the single sidewall has a thickness that is the same as or greater than that of one adjoining sidewalls of the ground structure 120. The other adjoining sidewalls include, but are not limited to, a sidewall of the ground structure to which the common sidewall is adjacent and directly connected.

In some scenarios, the RF filter 100 has an overall size of 3.6 mm by 4.8 mm. Accordingly, each shunt varactor 102, 104, 106 has a size of 1.1 mm by 1.4 mm. Each shunt inductor 108, 110, 112 has a size of 1.1 mm by 1.1 mm. Embodiments of the present invention are not limited to the particularities of such scenarios. However, it should be reiterated that such an RF filer architecture exhibits a 1.9 dB insertion loss across a 300 MHz bandwidth. This is a significant insertion loss improvement over conventional RF filter designs, such as those described above in the background section of the document.

Notably, the RF filter 100 can be fabricated using a process which allows the RF filter 100 to be fabricated without the use of the high heat required to fabricate conventional polysilicon based MEMS devices. In this regard, the material used to fabricate the RF filter 100 and the material used to fabricate an IC have melting points that are the same (e.g., a values ≤100° C.) or that have no more than a 100° C. difference. An exemplary fabrication process will be described below in relation to FIGS. 9A-9Z.

Figure 2:
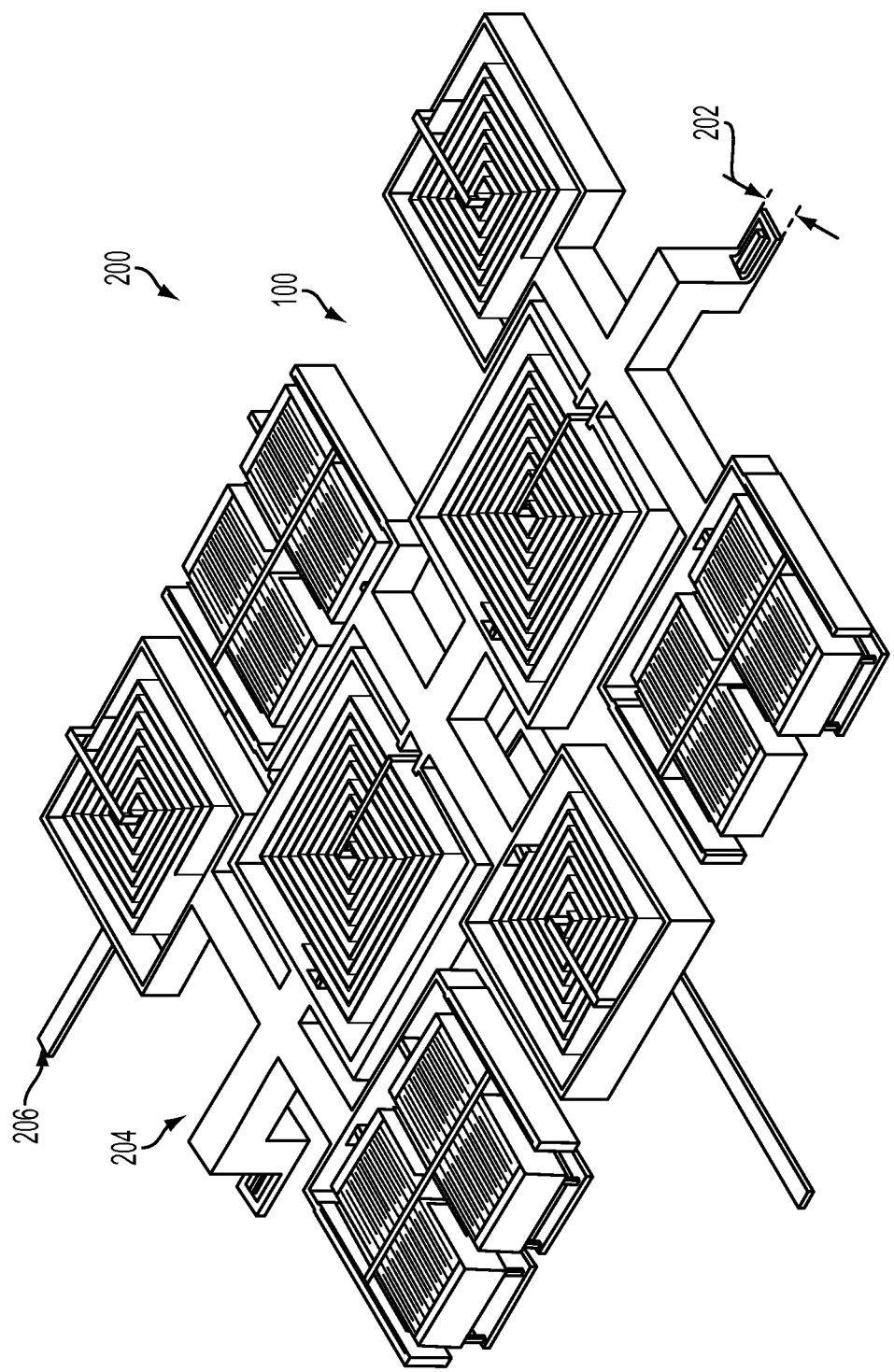
FIG. 2 is a top perspective view of an exemplary MEMS RF filter fabricated on a substrate that is useful for understanding the present invention.
Figure 3A:
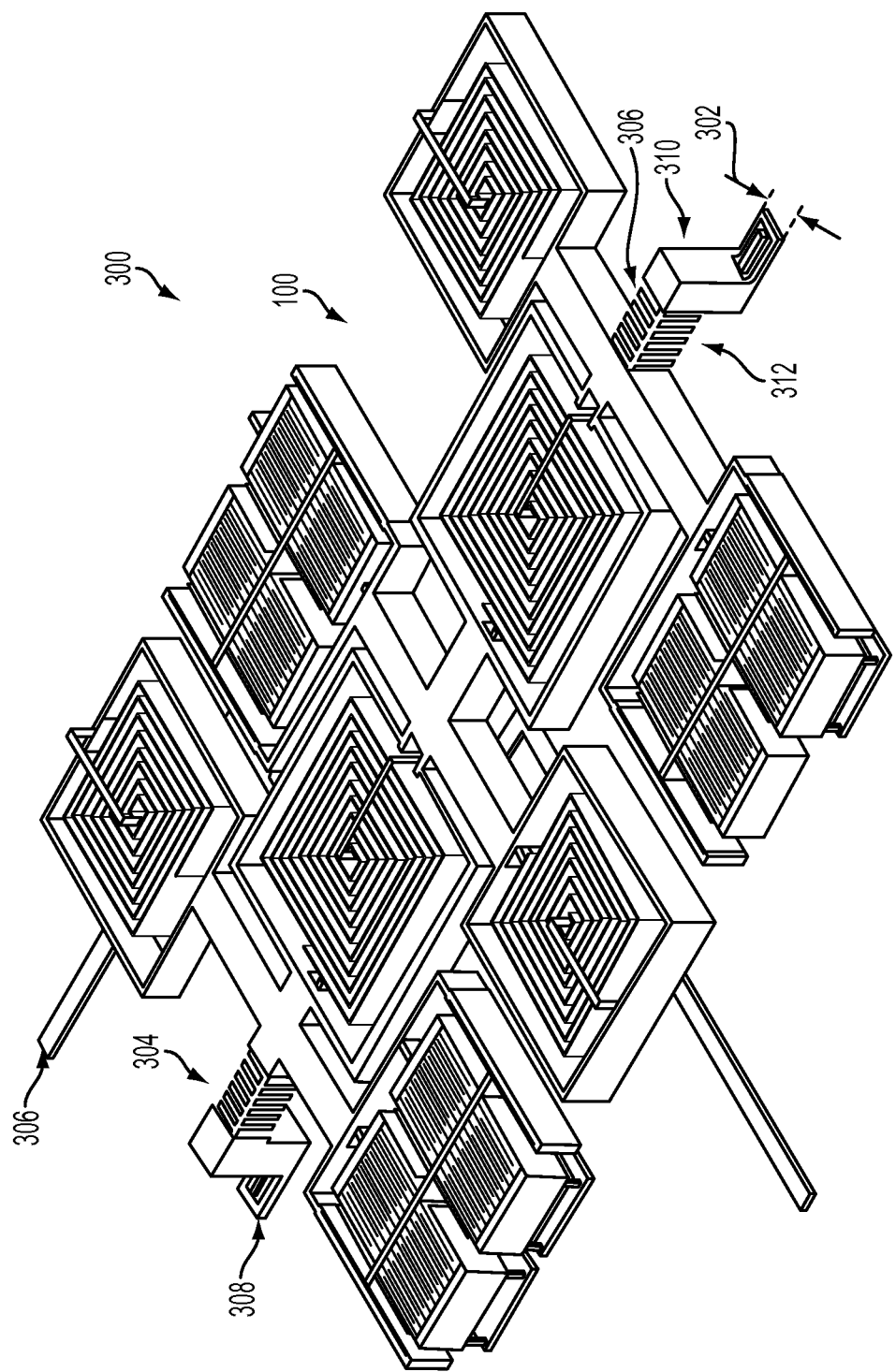
FIG. 3A is a top perspective view of an exemplary MEMS RF filter fabricated on a substrate that is useful for understanding the present invention.
Figure 3B:
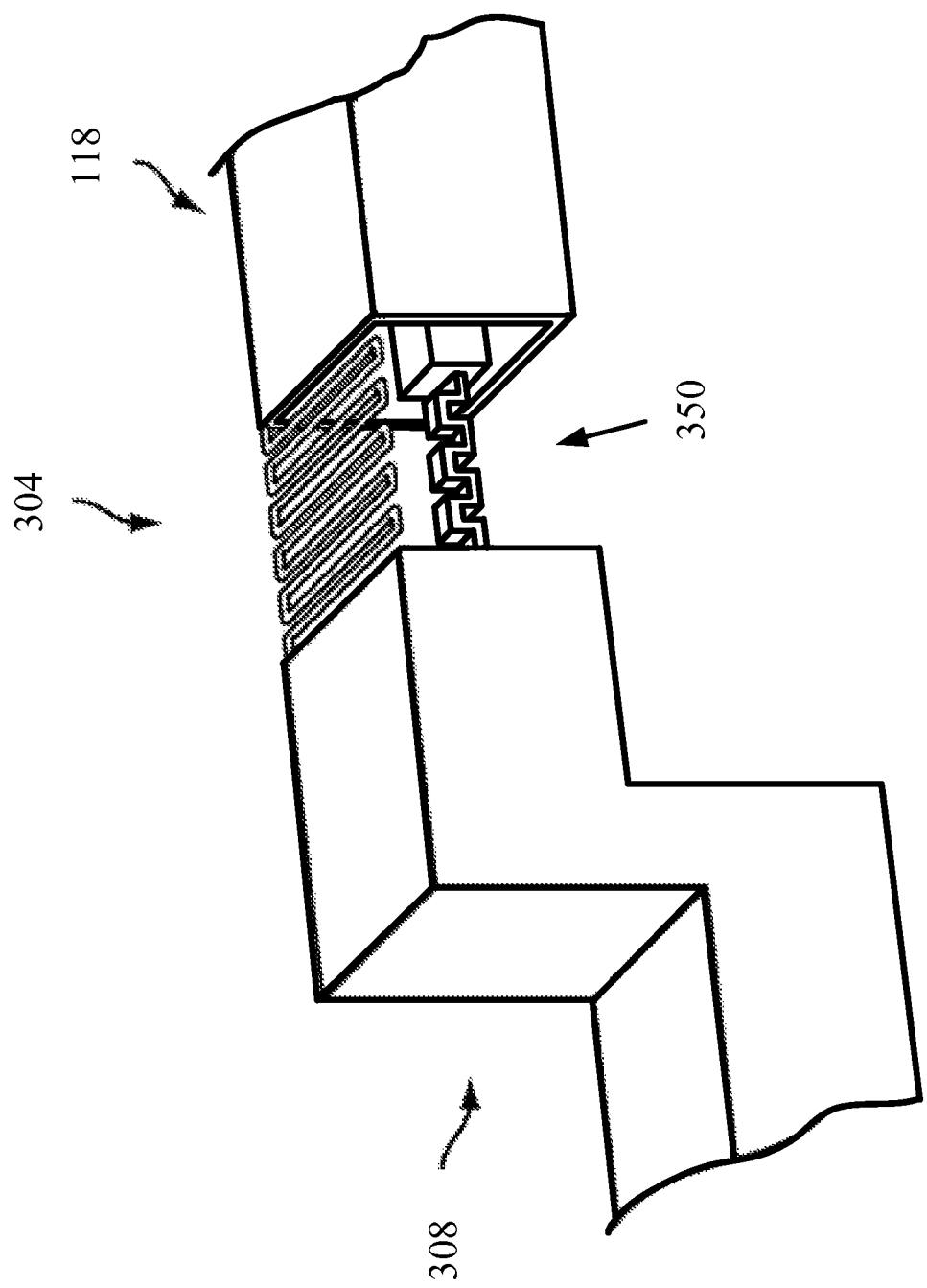
FIG. 3B is a schematic illustration which is useful for understanding the exemplary interconnection between a MEMS RF filter device and an external circuit of FIG. 3A.
Figure 6:
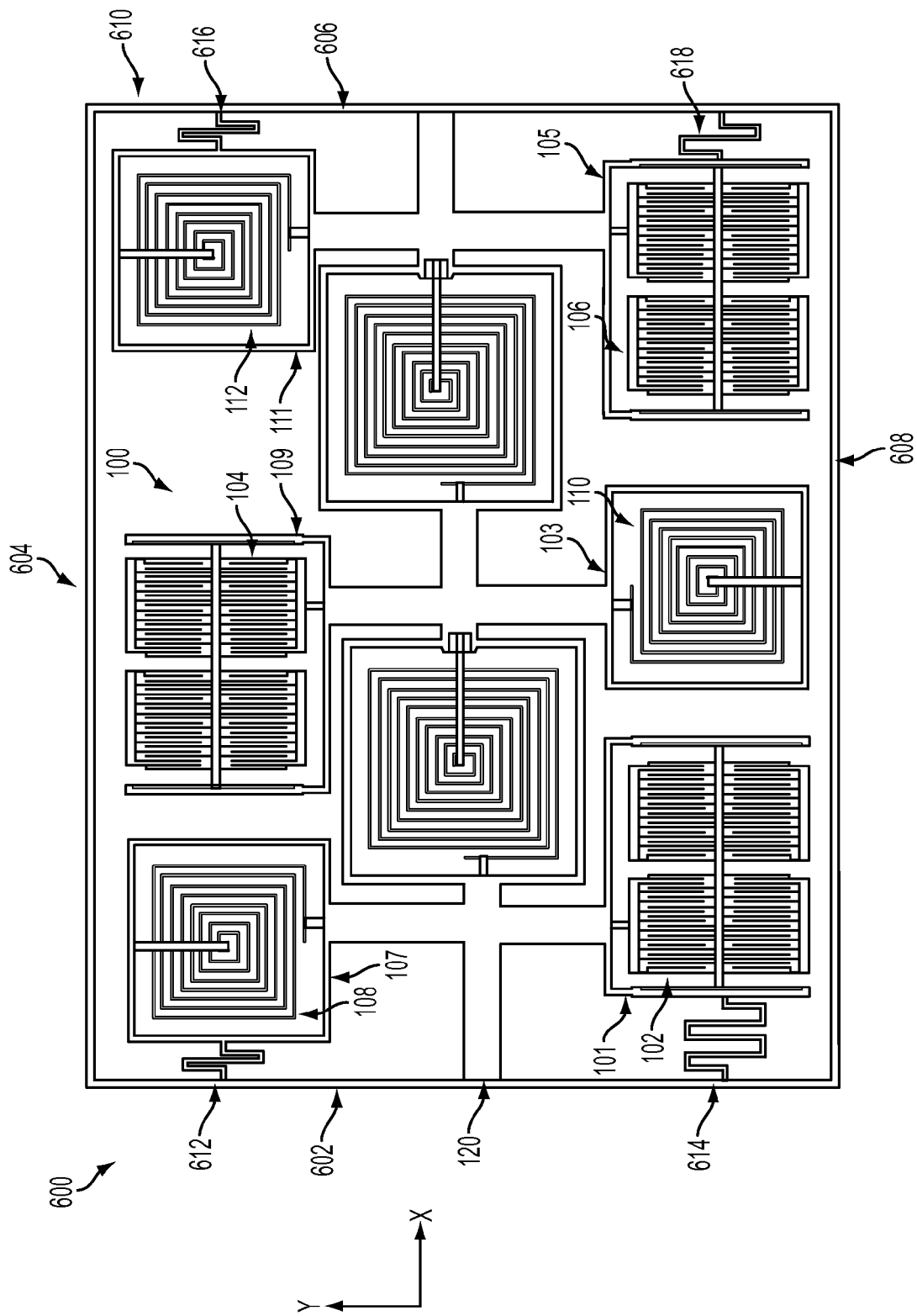
FIG. 6 is a top-down view of an exemplary MEMS RF filter with an isolation platform that is useful for understanding the present invention.
Figure 7:
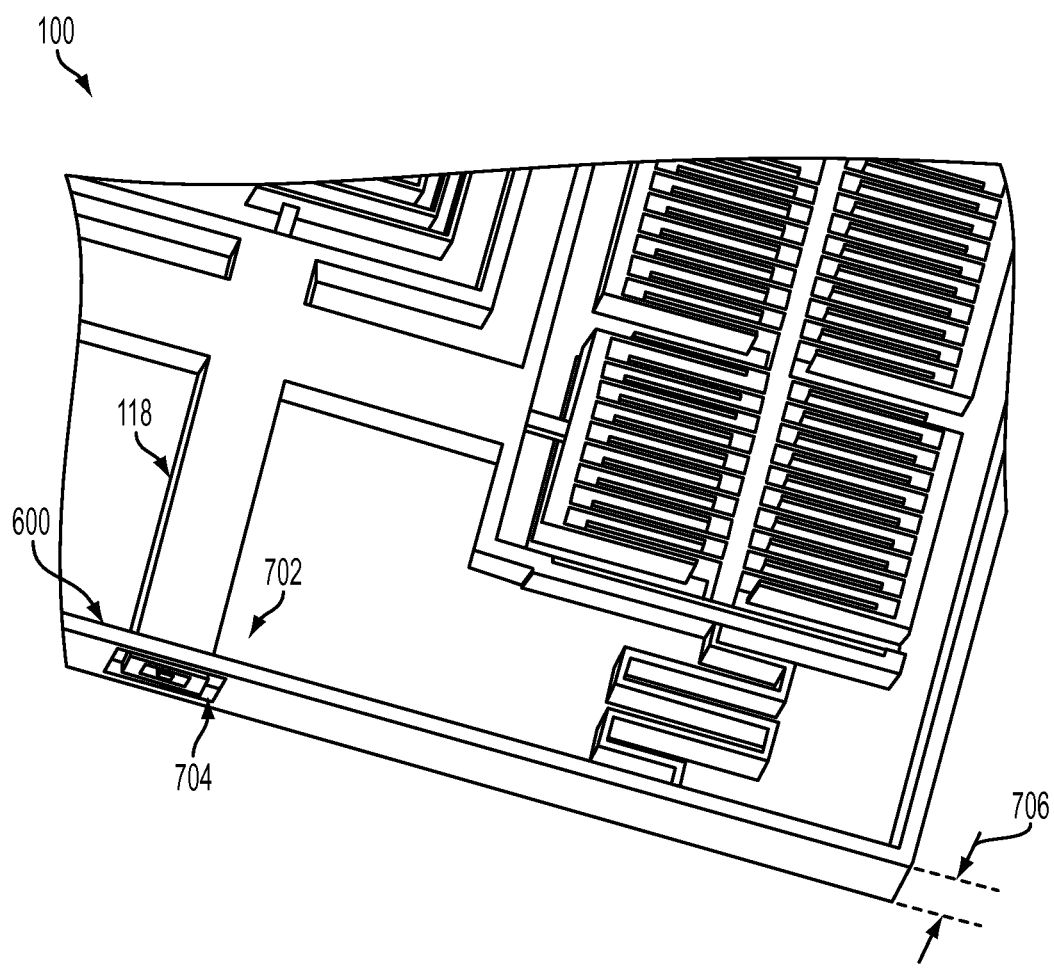
FIG. 7 is a perspective view of a portion of an exemplary MEMS RF filter with an isolation platform that is useful for understanding the present invention.
Figure 8:
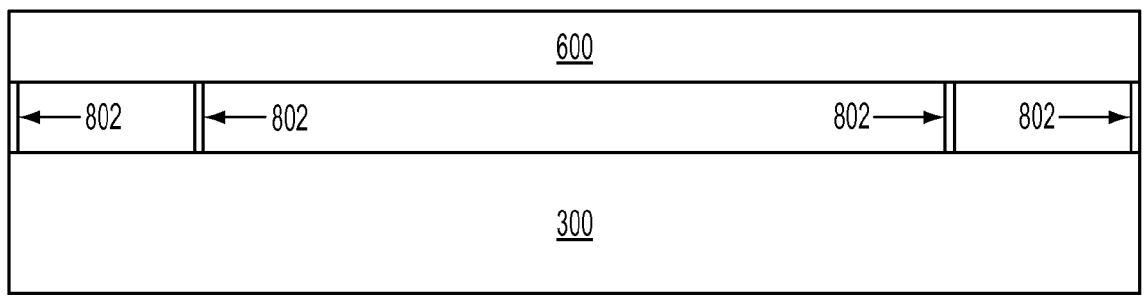
FIG. 8 is a schematic illustration of an isolation platform mechanically connected to a substrate that is useful for understanding the present invention.

The fabrication process also allows the RF filter 100 to be formed so as to be suspended above a substrate 200, 300. As will be described below, the RF filter 100 may be: (a) suspended over the substrate 200 exclusively by a rigid transition portion 204 as shown in FIG. 2; or (b) at least partially suspended above the substrate 200 via an isolation platform 600 as shown in FIGS. 6-8 and resilient interconnections 304, 306 with external circuitry as shown in FIGS. 3A-3B. Substrate 200, 300 can include, but is not limited to, a flat semiconductor wafer. In this regard, a dielectric gap 202, 302 is provided between the RF filter 100 and the substrate 200, 300.

By suspending the RF filter 100 above the substrate 200, 300, valuable space on the surface of the substrate 200 is made available for other circuitry 206, 306 thereby providing a more compact MEMS device as compared to conventional MEMS devices including RF filters. Notably, there is relatively minimal coupling (cross talk) of a signal traveling through the filter onto circuitry 206, 306 formed on the substrate 200, 300. For example, in some scenarios, the isolation is greater than 40 dB across 6 GHz.

As noted above, in some scenarios, the RF filter 100 is isolated from the substrate 300 via resilient interconnections 304, 306, as shown in FIG. 3A. The interconnections 304, 306 between the RF filter 100 and an external device (e.g., a switch) may be designed to ensure that vibrations from an external environment are not connected to the RF filter 100. In this regard, at least a portion of each interconnection 304, 306 may be designed to move in the directions of the vibrations. Such an interconnection design can include, but is not limited to: a wire bond (not shown) or a spring (e.g., spring 350 shown in FIG. 3B) interconnection electrically connecting the center conductor 122 of the transition portion 118 to a center conductor of a transition portion 308, 310 connected to the substrate 300; and/or a plurality of spring interconnections 312 electrically connecting each of the four sidewalls of the ground structure 120 to respective sidewalls of the respective transition portion 308, 310 connected to the substrate 300. Alternatively or additionally, the material used to form interconnections 304, 306 between the transition portion 118 is formed from a material with a relatively low mechanical stiffness.

Figure 4:
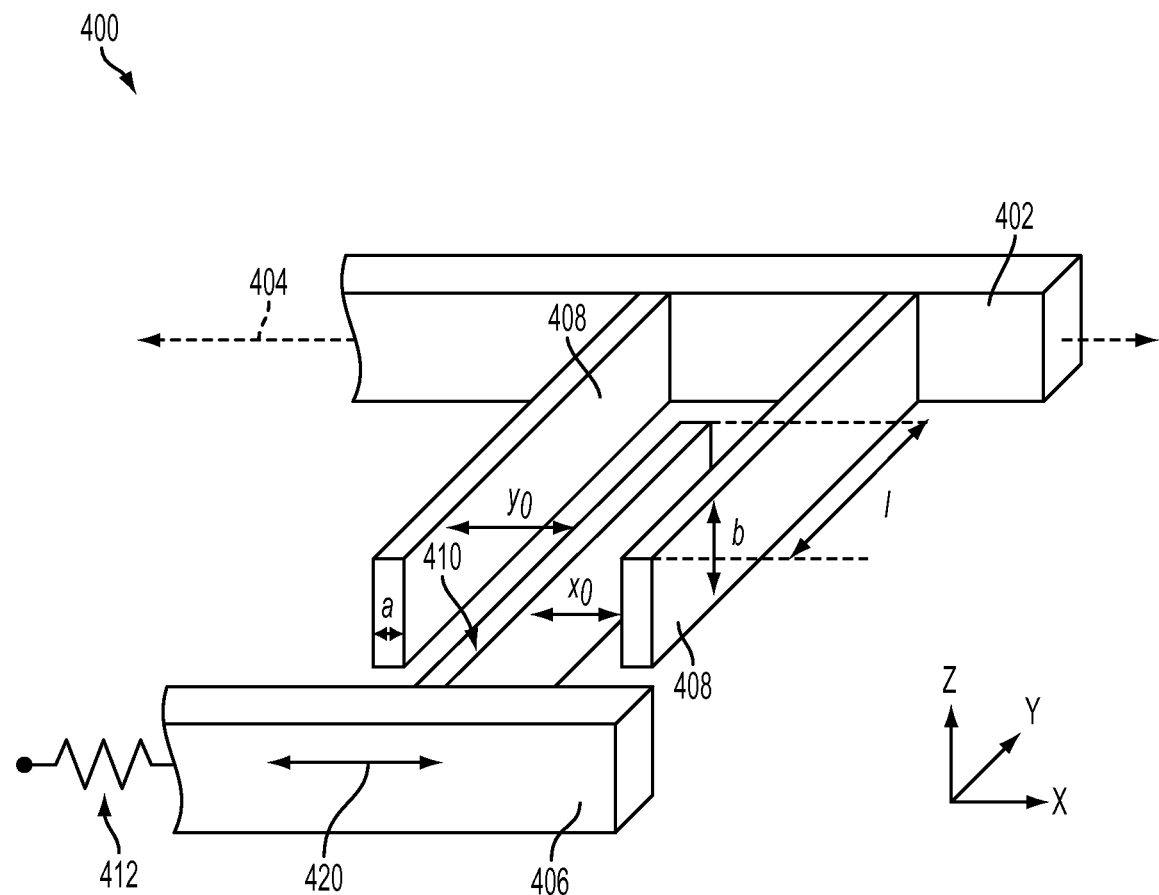
FIG. 4 is a schematic illustration of an exemplary architecture for a MEMS shunt varactor that is useful for understanding the present invention.

Referring now to FIG. 4, there is provided a schematic illustration of an exemplary architecture for a drive portion 400 of a shunt varactor. Each of the shunt varactors 102, 104, 106 of FIG. 1 can have a drive portion that is the same as or similar to that of FIG. 4. Drive portion 400 includes a drive comb structure 402 having a fixed position and extending along a longitudinal axis 404. Drive portion 400 also includes a truss comb structure 406 that extends substantially parallel to axis 404 and that can elastically move in the x direction along a motion axis 420 substantially parallel to axis 404 of the drive comb structure 402. For example, as shown in FIG. 4, truss comb structure 406 can include or be attached to at least one restorative or resilient component 212 connected to a fixed end. The resilient component 212 restores a position of truss comb structure 406 when no external forces are being applied. The drive comb structure 402 can have one or more drive fingers 408 extending therefrom towards truss comb structure 406. The truss comb structure 406 can similarly include one or more truss fingers 410 extending therefrom towards the drive comb structure 402.

As shown in FIG. 4, the drive comb structure 402 and the truss comb structure 406 can be positioned to be interdigitating. The term "interdigitating", as used herein with respect to comb structures, refers to arranging comb structures such that the fingers extending from such comb structures at least partially overlap and are substantially parallel.

In the exemplary architecture of FIG. 4, fingers 408 and 410 can each have a width and a height of a and b, respectively, and an overlap length of l. Although comb structures with multiple sets of fingers can be configured to have the same dimensional relationships (width, height, and overlap), the present invention is not limited in this regard and dimensional relationships can vary, even within a single shunt varactor. Furthermore, the portion shown in FIG. 4 and the dimensional relationship shown in FIG. 4 are only the electrically conductive portions of drive portion 400. As one of ordinary skill in the art will recognize, comb structures can further include structural portions comprising non-conductive or semi-conductive materials extending in the z direction to provide structural support for the conductive portions shown in FIG. 4.

The drive portion 400 shown in FIG. 4 operates on the principle of electrostatic attraction between adjacent interdigitating fingers. That is, motion of the truss comb structure 406 can be generated by developing a voltage difference between the drive comb structure 402 and the truss comb structure 406. In the case of drive portion 400, the voltages applied at comb structures 402, 406 are also seen at fingers 408, 410, respectively. The resulting voltage difference generates an attractive force between fingers 408 and 410. If the generated electrostatic force between fingers 408 and 410 is sufficiently large to overcome the other forces operating on truss comb structure 406 (such as a spring constant of resilient component 412), the electrostatic force will cause the motion of the truss comb structure 406 between a first interdigitated position (resting position at a zero voltage difference) and a second interdigitated position (position at a non-zero voltage difference) among motion axis 420. Once the voltage difference is reduced to zero, resilient component 412 restores the position of truss comb structure 406 to the first interdigitating position.

As shown in FIG. 4, each finger 410 in truss comb structure 406 can be disposed between two fingers 408 of drive comb structure 402. Accordingly, an electrostatic force is generated on both sides of finger 410 when a voltage difference is developed between comb structures 402 and 406. Therefore, to ensure movement of truss comb structure 406 in only one direction in response to a voltage difference, fingers 410 are positioned with respect to fingers 408 such that the electrostatic force in a first direction along the x-axis is greater than the electrostatic force in an opposite direction in the x-axis. This is accomplished by configuring the finger spacing (i.e., spacing between fingers of interdigitated comb structures) in the first direction along the x-axis ($x_0$) and the finger spacing in the opposite direction along the x-axis ($y_0$) to be different when the voltage difference is zero. Since the amount of electrostatic force is inversely proportional to the distance between fingers, the motion of truss comb structure will be in the direction associated with the smaller of $x_0$ and $y_0$.

The drive portion 400 provides a control mechanism for horizontal actuation in a shunt varactor that can be precisely controlled by adjusting the voltage difference between the drive and truss comb structures. This allows continuous adjustment over a range of interdigitating positions (by adjusting the voltage continuously over a voltage range).

Although the drive portion described above could be connected to any variety of devices, using such a drive portion for various types of devices will only provide a partial improvement in manufacturing robustness and device reliability. In general, the robustness of the IC fabrication techniques used for fabricating MEMS devices and other types of devices is increased by reducing the variety of feature types and dimensional variation in each layer. The present invention exploits this characteristic. In particular, another aspect of the invention is to use the comb structure drive portion in conjunction with a comb structure based varactor portion, as shown below in FIG. 5.

Figure 5:
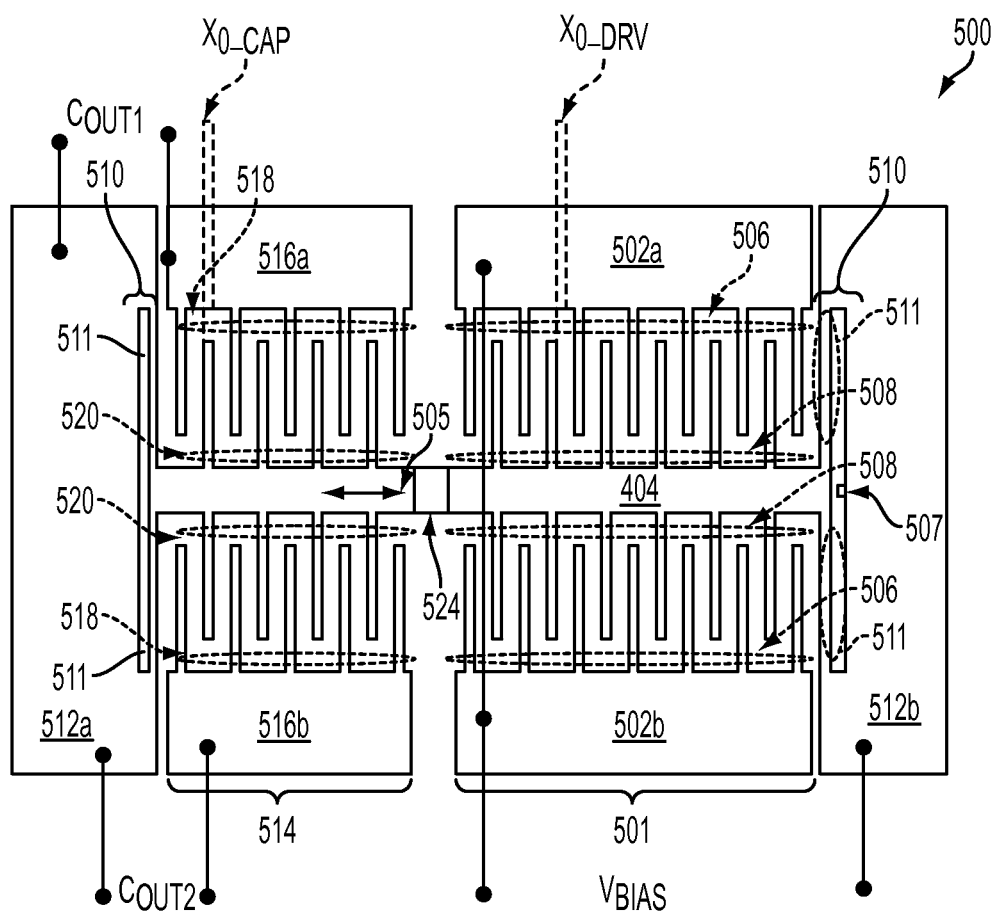
FIG. 5 is a top-down view of an exemplary MEMS shunt varactor that is useful for understanding the present invention.

FIG. 5 shows a top-down view of an exemplary MEMS shunt varactor 500 that is useful for understanding the present invention. Each of the shunt varactors 102, 104, 106 of FIG. 1 can be the same as or similar to the MEMS shunt varactor 500 of FIG. 5. As shown in FIG. 5, varactor 500 includes a drive portion 501, similar to the drive portion 400 described above in relation to FIG. 4. That is, drive portion 501 includes drive comb structures 502a and 502b (collectively 502), a truss comb structure 504, drive fingers 506, and truss fingers 508.

Truss comb structure 504 also includes resilient portions 510 with fixed ends 512a and 512b (collectively 512). Resilient portions 510 comprise resilient or flexible reed structures 511 mechanically coupling truss comb structure 504 to fixed ends 512. Therefore, a leaf spring structure is effectively formed on the two ends of truss comb structure. In operation, as a force is exerted on truss comb structure 504 (by generating a voltage difference between fingers 506 and 508) the reed structures 511 deform to allow truss comb structure to move along motion axis 505 from a first interdigitated position to at least a second interdigitated position. Once the force is no longer being exerted, the reed structures 511 apply a restorative force to restore the position of the truss comb structure 504 to a first interdigitated position. The operation and configuration of components 502-510 is substantially similar to that of components 402, 406, 408, 410, 412 of FIG. 4. Therefore, the discussion of FIG. 4 is sufficient for describing the operation and configuration for components 502-510 of FIG. 5. As described above, in addition to the drive portion 501, varactor 500 also includes a variable capacitor or varactor portion 514, as shown in FIG. 5. The varactor portion 514 includes input/output comb structures 516a and 516b (collectively 516) having a fixed position. The input/output comb structures 516 can also have one or more sense fingers 518 extending therefrom. Within the varactor portion 514 of varactor 500, the truss comb structure 504 can additionally include one or more additional truss fingers 520 extending therefrom and interdigitating sense fingers 518. Therefore, the truss comb structure 504 interdigitates (via fingers 508 and fingers 520) both the drive fingers 506 and the sense fingers 518. As a result, the truss comb structure 504 mechanically connects and is part of both the drive portion 501 and the varactor portion 514.

Fingers 506, 508, 518 and 520 are shown to be similarly dimensioned and having a same amount of overlap. However, the invention is not limited in this regard and dimensional relationships can be different in the drive portion 501 and varactor portion 514. Furthermore, the dimensional relationship can also vary within the varactor portion 514. Additionally, as described above with respect to FIG. 4, the comb structures 502, 504 and 516 can further include conductive portions and structural portions, comprising non-conductive or semi-conductive materials, to provide structure support for the conductive portions.

As described above, varactor 500 is configured to provide functionality as a variable capacitor or varactor. In particular, the truss comb structure 504 is configured to provide an adjustable capacitance based on adjustment of the gap between the first capacitor plate, provided by fingers 518, and a second capacitor plate, provided by fingers 520. Therefore, varactor 500 forms a first adjustable capacitor or varactor between truss comb structure 516a and truss comb structure 504, with a capacitance of $C_{OUT1}$, and a second adjustable capacitor or varactor between comb structure 516b and truss comb structure 504, with a capacitance of $C_{OUT2}$.

These first and second varactors can be used separately or in combination. In combination, these varactors can be connected to provide capacitance in series or parallel. For example, to provide a series capacitance, the capacitance can be measured between comb structures 516a and 516b. In contrast to provide a parallel capacitance, the capacitance can be measured between comb structures 516a, 516b and fixed end 512a (if electrically connected to fingers 520).

In some scenarios, a discontinuity 524 is provided to isolate fingers 520 from fingers 508. As described above, the discontinuity 524 can be provided to reduce any interference between the varactor portion 514 and the drive portion 501. For example, to prevent the charge stored between fingers 518 and 520 from affecting a voltage difference between fingers 506 and 508 and vice versa. However, if fixed ends 512a and 512b are both connected to ground, isolation between drive portion 401 and varactor portion 514 is maintained without requiring such discontinuity 524.

Varactor 500 operates as follows. A circuit (not shown) is connected to comb structures 516a, 516b, and fixed end 512a (if necessary, as described above). To increase amount of capacitance at $C_{OUT1}$ and $C_{OUT2}$, a voltage difference ($V_{BIAS}$) is developed between fingers 506 and 508 to generate electrostatic attraction between these fingers. For example, $V_{BIAS}$ is applied across drive comb structures 502 and fixed ends 512b (which is electrically connected to fingers 508) to cause sufficient electrostatic attraction between fingers 506 and 508 to induce motion of truss comb structure 504, and consequently motion of fingers 520 towards fingers 518, reducing a spacing $X_{0\_CAP}$ between fingers 518 and 520. Consequently, the changing of the spacing between the capacitor plates results in a different capacitance value for both $C_{OUT1}$ and $C_{OUT2}$. Therefore, to increase capacitance, $V_{BIAS}$ is selected to create an electrostatic force that is at least greater than the restorative force of reed structures 511 to cause motion of truss comb structure 504 along motion axis 505. Afterwards, to decrease the capacitance, $V_{BIAS}$ is reduced such that the electrostatic force is less than the restoring force applied by reed structures 511. The restoring force then acts on truss comb structure 504 to increase the gap between fingers 520 and fingers 518, and thus lower the capacitance.

Referring now to FIG. 6, there is provided a top-down view of the RF filter 100 with an isolation platform 600 that is useful for understanding the present invention. The isolation platform 600 is configured to protect the RF filter 100 by absorbing vibrations from an external environment prior to arrival thereat. In this regard, the isolation platform 600 is (a) coupled to the substrate 300 so as to be suspended above the substrate (as shown in FIG. 8) using one or more mechanical support structures 802, (b) coupled to the RF filter 100 so as to suspend the RF filter 100 over the substrate 300, (c) designed such that the RF filter 100 is isolated from external sources of vibration, and (d) designed to have a relatively large amount of natural damping such that damping devices are not needed.

As shown in FIG. 6, the isolation platform 600 comprises at least one sidewall framing or surrounding a periphery of the RF filter 100. For example, in some scenarios, the isolation platform 600 comprises four adjoining sidewalls 602, 604, 606, 608 defining a rectangular frame 610, as shown in FIG. 6. In other scenarios, the isolation platform 600 comprises a single sidewall (not shown) defining a circular frame (not shown) which circumscribes or encircles the periphery of the RF filter 100.

The isolation platform 600 also comprises one or more resilient components (e.g., springs) 612, 614, 616, 618 for absorbing vibrations from an external environment. The resilient components are formed from a metal material. As such, the metal resilient components (e.g., springs) 612, 614, 616, 618 store energy when compressed. However, the stored energy is not or only minimally coupled to the RF filter when the resilient components return to their pre-stressed shapes. This is because metal resilient components (e.g., springs) have a relatively large amount of natural damping in them. Accordingly, the amplitude of vibration is decreased by the resilient components (e.g., springs) 612, 614, 616, 618. Consequently, the force exerted when the resilient components (e.g., springs) 612, 614, 616, 618 return to their pre-stressed shapes is not proportional to the amount it is compressed.

Each resilient component 612, 614, 616, 618 is coupled between the frame 610 and a respective isolation portion 101, 103, 105, 107, 109, 111, 113, 115 of the ground structure 120. As such, the isolation platform 600 is grounded. The resilient components isolate the varactors 102, 104, 106 from vibrations in at least the x direction. In this regard, it should be understood that the leaf springs of the varactors are designed to have a low actuation voltage. As such, the leaf springs are relatively stiff in the y direction and z direction, and therefore are not or only minimally susceptible to vibrations in those directions. However, the leaf springs are relatively flexible in the x direction, and therefore are susceptible to vibrations in that direction. Therefore, the resilient components 612, 614, 616, 618 of the isolation platform 600 provide a means for isolating the x direction vibrations from the varactors such that their performances are not affected thereby. In scenarios where the leaf springs of the varactors are susceptible to vibrations in the y and/or z directions, the isolation platform 600 can include additional resilient components (not shown) for absorbing such y and/or z direction vibrations prior to reaching the RF filter 100. For example, the isolation platform 600 can alternatively or additionally include resilient components (not shown) coupled to sidewall 604 and/or sidewall 608.

The resilient components 612, 614, 616, 618 are designed to have the same or different geometries and/or orientations. For example, as shown in FIG. 6, the resilient components 612, 616 and 618 have the same orientations. Resilient components 612, 616 and 618 have the same serpentine shape. However, resilient component 614 has a different serpentine shape than that of resilient components 612, 616, 618. Embodiments of the present invention are not limited in this regard.

The RF filter 100 and the isolation platform 600 can be simultaneously fabricated using a process which allows the structures thereof to be fabricated without the use of the high heat required to fabricate conventional polysilicon based MEMS devices. In this regard, the material used to fabricate the RF filter 100, the material used to fabricate an IC, and the material used to fabricate the isolation platform 600 have melting points that are the same (e.g., a values ≤100° C.) or that have no more than a 100° C. difference. For example, in some scenarios, the RF filter, IC and isolation platform are fabricated using the same metal material, such as copper.

Referring now to FIG. 7, there is provided a perspective view of a portion of the RF filter 100 with the isolation platform 600 that is useful for understanding the present invention. As shown in FIG. 7, the frame 610 has an aperture 700 formed therethrough at a location where a first terminal 702 (e.g., an input terminal) of the transition portion 118 of the RF filter 100 resides. Although not shown in FIG. 7, another aperture is formed through the frame 610 at a location where a second terminal (e.g., an output terminal not shown in FIG. 7) of the transition portion 118 of the RF filter 100 resides. Each aperture 700 is sized and shaped to allow the transition portion 118 to pass therethrough, and also to provide a dielectric gap 704 between all four sides of the transition portion 118 and the frame 610. The dielectric gap 704 ensures that vibrations from the external environment (e.g., the external transition portion and/or external electronic component to which the transition portion is electrically connected) are not directly coupled from the isolation platform 600 to the RF filter 100.

The height 706 of each sidewall of the frame 610 can be the same as or different than the overall height of one or more components of the RF filter 100. For example, as shown in FIG. 7, height 706 of each sidewall of the frame 610 is greater than that of the inductors 108, 110, 112, 114, 116 and the transition portion 118, but less than that of the varactors 102, 104, 106. Embodiments of the present invention are not limited to the particularities of this example architecture.

Figure 9A:
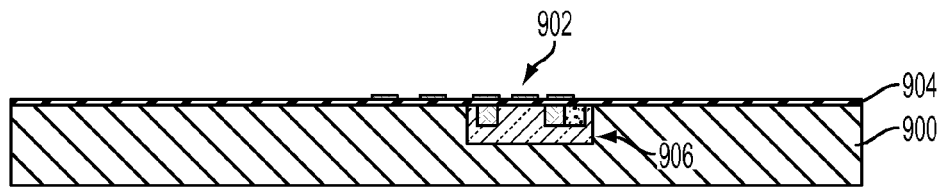
FIGS. 9A-9Z show partial cross-sections of components of a MEMS device during various steps of a fabrication process in accordance with embodiments of the present invention.

The RF filter structure described above can be fabricated using a MEMS fabrication technique. This is illustrated in FIGS. 9A-9Z. FIGS. 9A-9Z show partial cross-sections of certain components of a MEMS device (e.g., the MEMS device shown in FIGS. 5-8) during various steps of a fabrication process. Notably, the fabrication process described below in FIGS. 9A-9Z is sufficient for understanding how an entire MEMS device can be fabricated in accordance with embodiments of the present invention.

Manufacture of the MEMS device begins with the formation of an interface layer 902 on a substrate 900. An isolation layer 904 also exists on the substrate 900. After the formation of the interface layer 902, various steps are performed to fabricate an RF filter with an isolation platform that is suspended above the electronic circuit 900. These steps are described below in relation to FIGS. 9B-9Z.

Figure 9B:
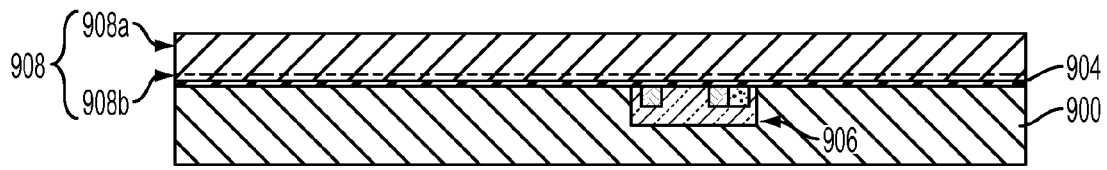
Figure 9C:
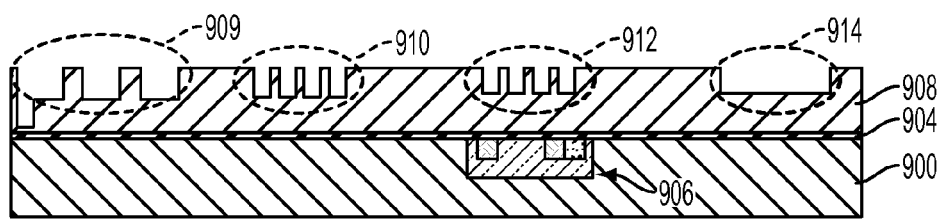
Figure 9D:
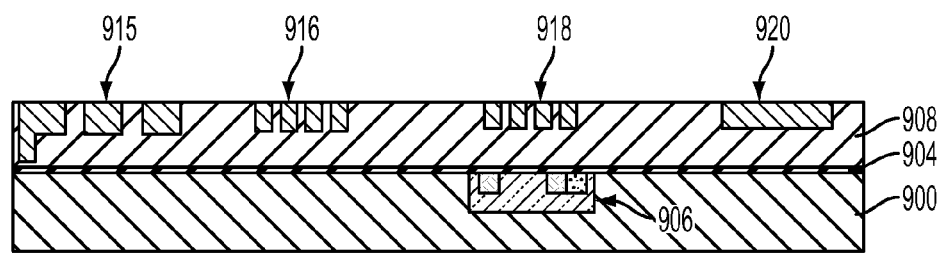

As shown in FIG. 9B, a first and second resist layer 908a and 908b (collectively 908) is disposed on the top surface of the substrate 900 so as to cover the circuitry 906. Next, the second resist layer 908b is patterned to form at least partially an isolation platform (e.g., isolation platform 600 of FIG. 6), shunt varactors (e.g., a shunt varactor 102, 104 and/or 106 of FIG. 1), inductors (e.g., inductor 108, 110, 112, 114 and/or 116 of FIG. 1), and a transition portion (e.g., transition portion 118 of FIG. 1) of the RF filter (e.g., RF filter 100 of FIG. 1). A schematic illustration of second resist layer 908b which has been patterned is provided in FIG. 9C. As shown in FIG. 9C, at least four patterns have been formed in the second resist layer 908b. A first pattern 909 is provided for forming a frame and a resilient component of the isolation platform. A second pattern 910 is provided for forming a lower portion of a comb structure of a shunt varactor. A third pattern 912 is provided for forming a lower portion of an inductor coil. A fourth pattern 914 is provided for forming a lower portion of a transition portion. Therefore, each pattern 909, 910, 912, 914 is then filled with a conductive material 915-920, as shown in FIG. 9D.

Notably, the relative orientations and spacing between the patterns 909, 910, 912, 914 have simply been selected for ease of explanation. Embodiments of the present invention are not limited to the relative orientations and component spacing shown in FIGS. 9B-9Z.

Figure 9E:
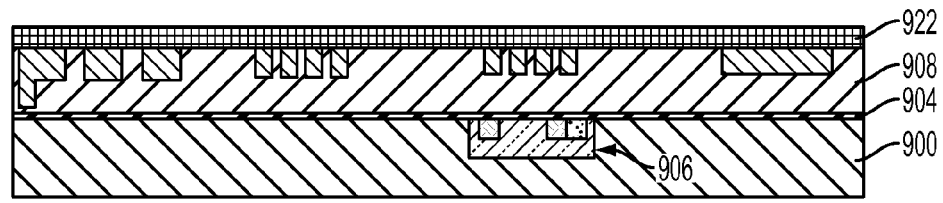
Figure 9F:
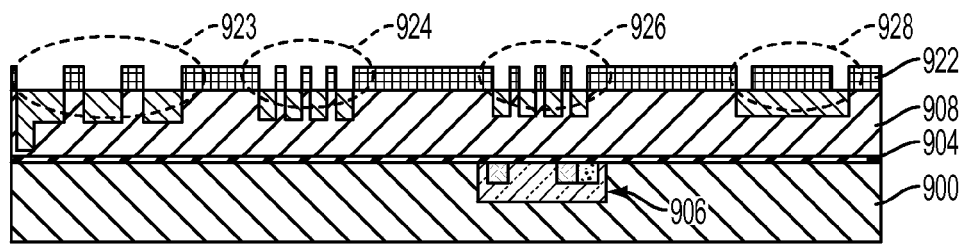
Figure 9G:
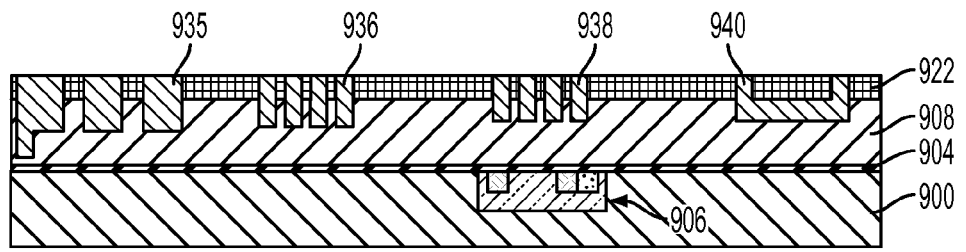

In FIG. 9E, a third resist layer 922 is disposed over the resist layers 908 and conductive material 915-920. The third resist layer 922 is then patterned in FIG. 9F for forming at least a portion of a middle section of the isolation platform, comb structure, inductor coil, and transition portion. As such, four patterns 923-928 are formed in the third resist layer 922. Pattern 923 is provided for forming a portion of a middle section of the frame and resilient component of the isolation platform. Pattern 924 is provided for forming a portion of middle section of the comb structure of the shunt varactor. Pattern 926 is provided for forming a portion of a middle section of an inductor coil. Pattern 928 is provided for forming a portion of a middle section of a transition portion. Therefore, each pattern 923-928 is then filled with the conductive material 935-940, as shown in FIG. 9G.

Figure 9H:
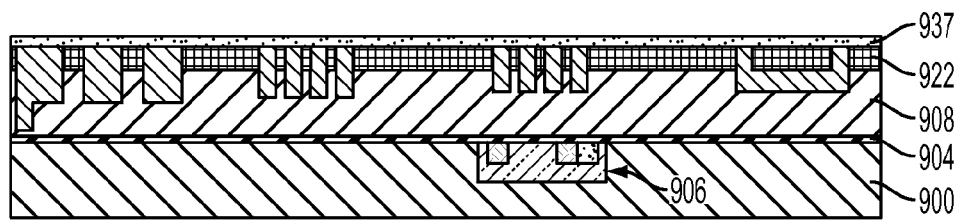
Figure 9I:
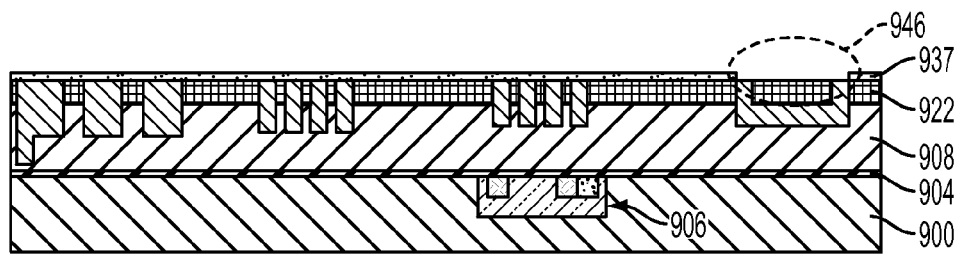
Figure 9J:
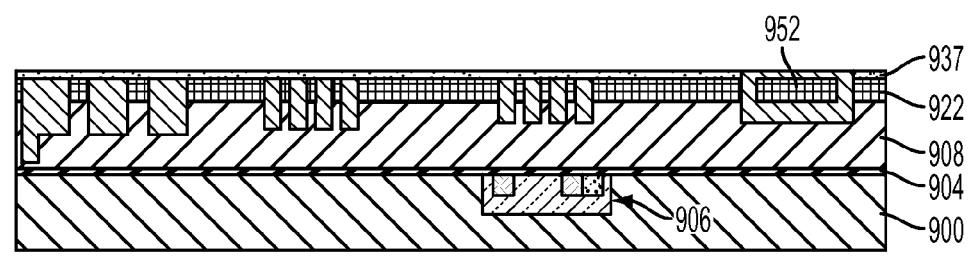

In FIG. 9H, a fourth resist layer 937 is disposed over the third resist layer 922 and conductive material 935-940. The fourth resists layer 937 is then patterned in FIG. 9I for forming a dielectric strap which will support a center conductor (e.g., center conductor 122 of FIG. 1) within the ground structure (e.g., ground structure 120 of FIG. 1) of the transition portion. Therefore, pattern 946 is filled with a non-conductive material 952 as shown in FIG. 9J.

Figure 9K:
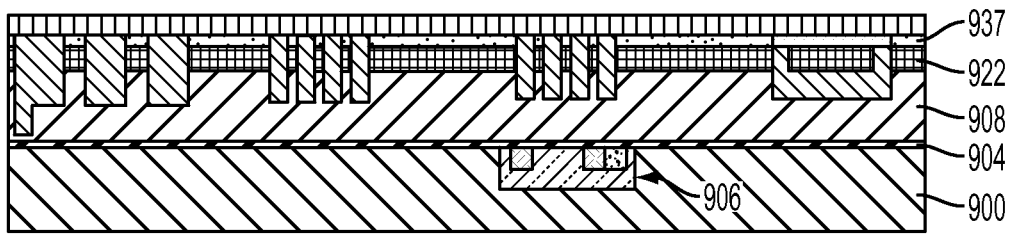
Figure 9L:
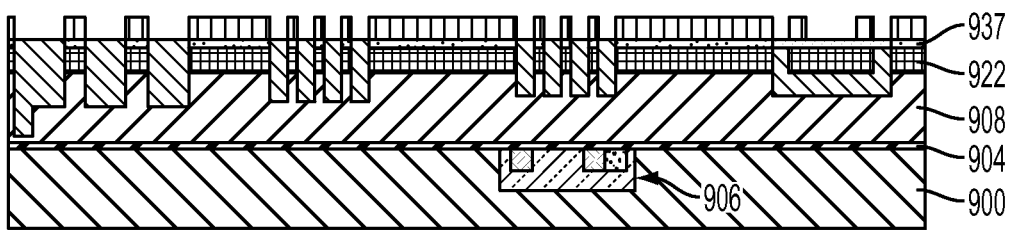
Figure 9M:
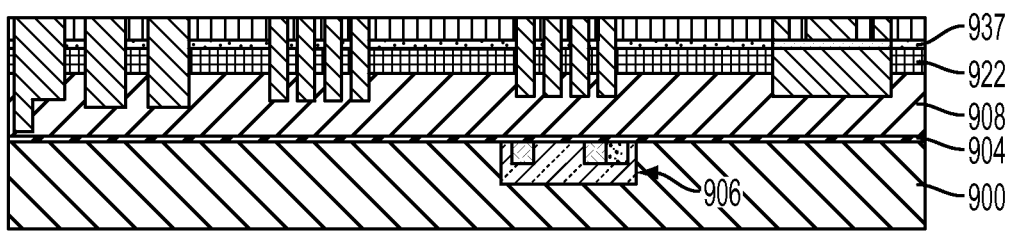
Figure 9N:
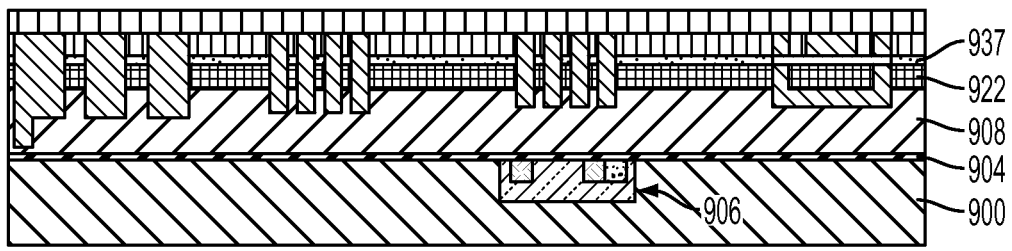
Figure 9O:
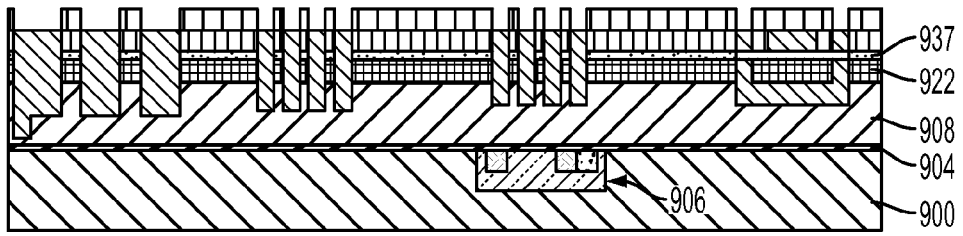
Figure 9P:
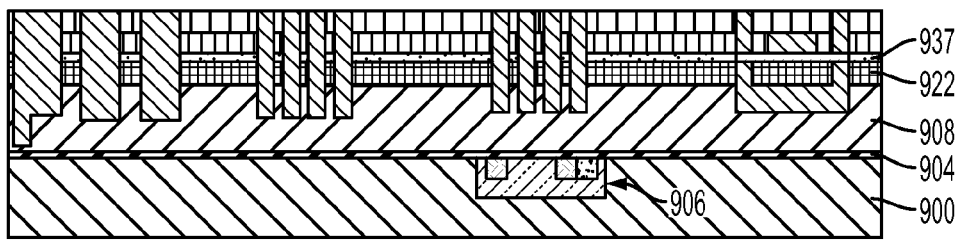
Figure 9Q:
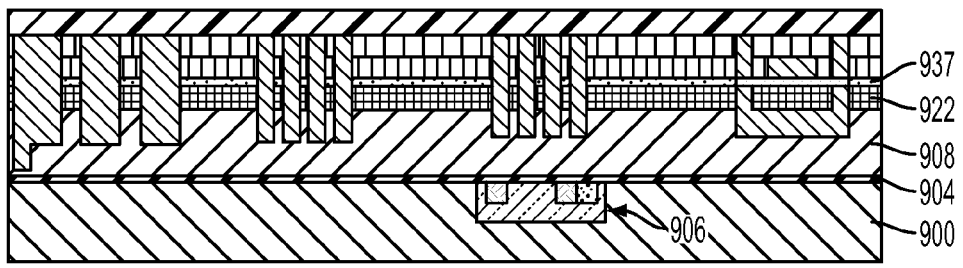
Figure 9R:
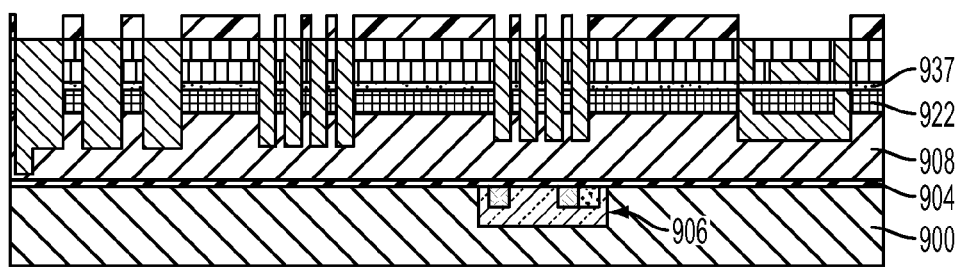
Figure 9S:
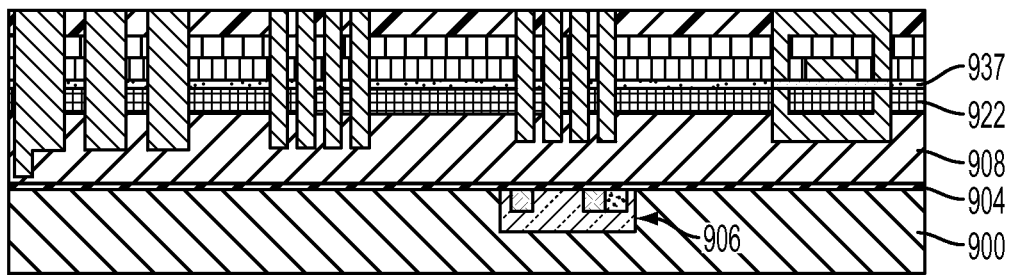
Figure 9T:
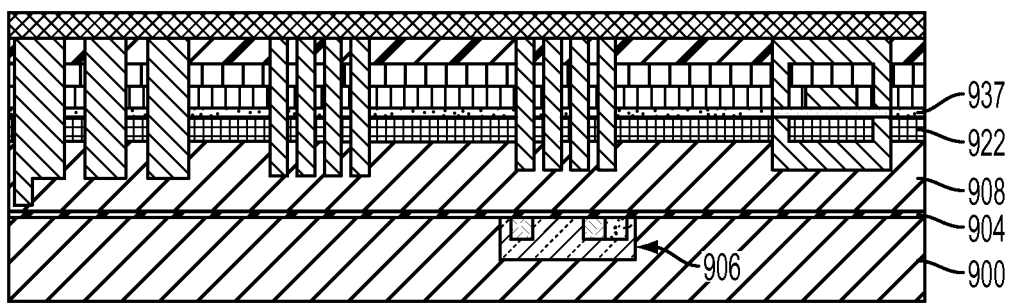
Figure 9U:
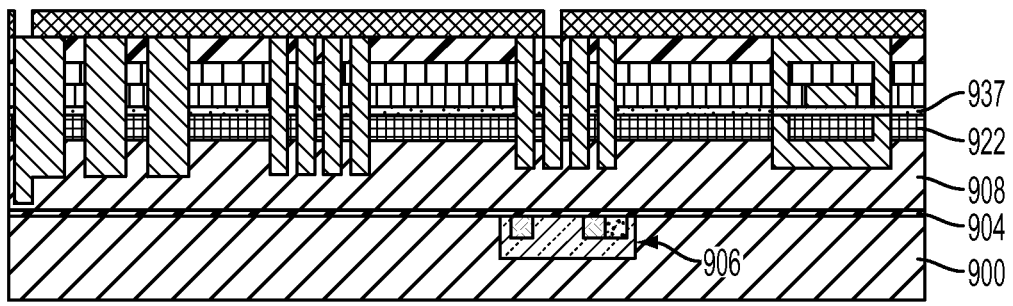
Figure 9V:
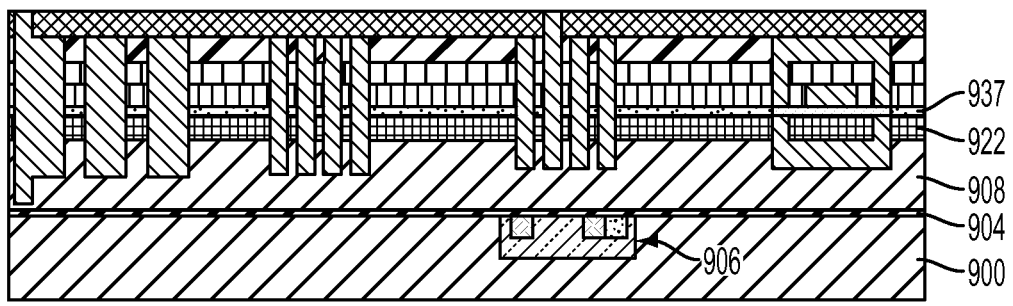
Figure 9W:
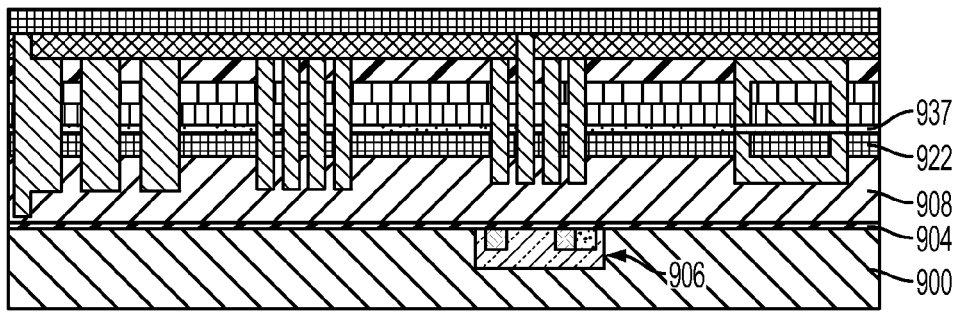
Figure 9X:
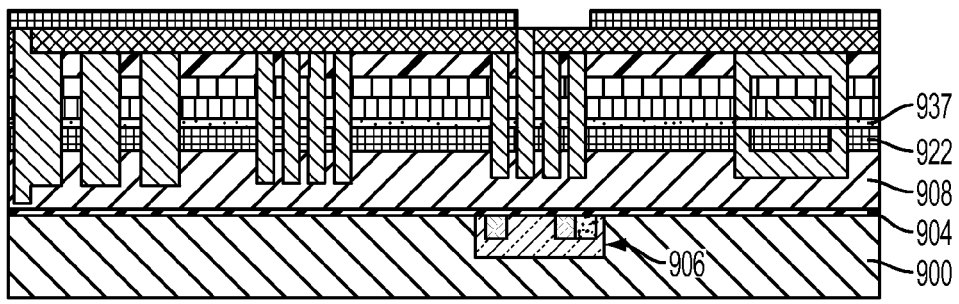
Figure 9Y:
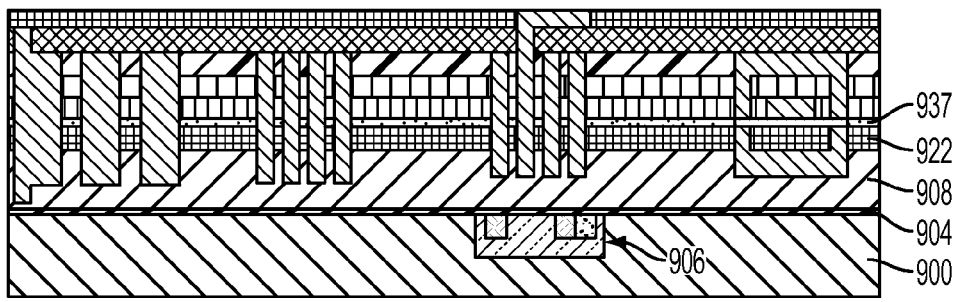
Figure 9Z:
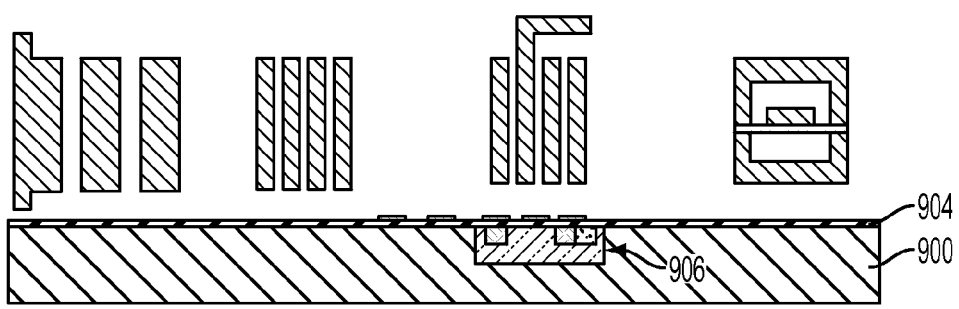

This process of disposing, patterning and filling of resists layers is repeated as shown in FIGS. 9K-9Y until the RF filter structure of FIG. 9Y is formed. Subsequently, the resist layers are removed as shown in FIG. 9Z. As a result of removing the resists layers, the RF filter structure with the isolation platform is suspended over the substrate 900. The RF filter is electrically isolated from the circuit 902 via air. A schematic illustration of an exemplary RF filter suspended over a substrate is shown in FIGS. 2 and 3A which were discussed above. A schematic illustration of an exemplary RF filter with an isolation platform is provided in FIGS. 6-8.

As noted above, the inductors 108, 110, 112, 114, 116 of the RF filter 100 are not limited to the architectures shown in FIGS. 1-7. Exemplary alternative architectures for the inductors 108, 110, 112, 114, 116 of the RF filter 100 will now be described in relation to FIGS. 10-13.

Figure 10:
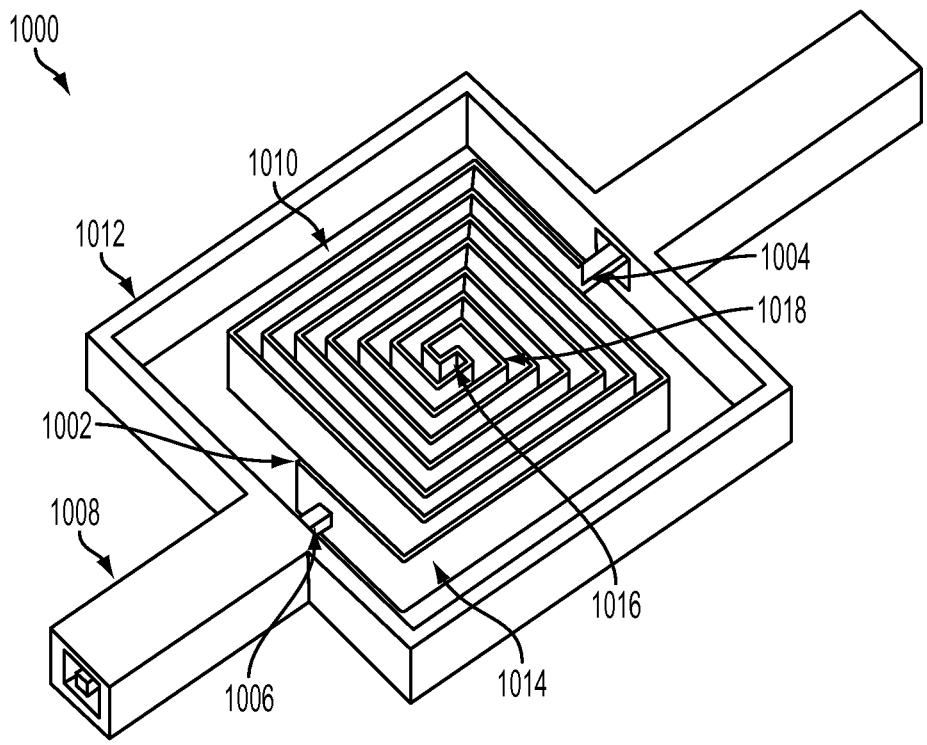
FIGS. 10-11 each provide perspective views of differential inductors that is useful for understanding the present invention.

FIG. 10 provides a top perspective view of an exemplary differential inductor 1000. Inductors 114, 116 of the RF filter 100 can be the same as or similar to differential inductor 1000. In the case of inductors 108, 110, 112 of the RF filter 100, the inductor architecture schematically illustrated in FIG. 10 can be modified such that one of the two inductor ports 1002, 1004 is connected to the ground structure 1012 as opposed to the center conductor 1006 of the transition portion 1008. Notably, the differential inductor 1000 advantageously has a larger Q factor in a small area as compared to single-end inductors. Also, in some scenarios, the differential inductor 1000 has an aspect ratio of 20:1 for inductor windings and has well contained electric fields in the windings.

As shown in FIG. 10, differential inductor 1000 comprises a coil 1010 having a first inductor port 1002 and a second inductor port 1004. Each inductor port 1004 is coupled to a center conductor 1006 of a transition portion 1008. The coil 1010 is designed such that a pass-over structure is not required for connecting a respective inductor port to a transition portion. In this regard, the coil 1010 comprises a first coil portion 1014 defined by windings traveling along a first serpentine path in a direction towards a center 1016 of the inductor 1000 and a second coil portion 1018 defined by windings traveling along a second serpentine path in a direction away from the center 1016 of the inductor 1000. At least a portion of each winding of the second coil portion 1018 is disposed between two adjacent windings of the first coil portion 1014. As a result, there is an increased amount of inductance coupling effects between the windings of the inductor 1000, and therefore a larger inductance value is obtained in the same or smaller total area as compared to the inductor architecture shown in FIG. 1. The first and second coil portions 1014, 1018 are electrically coupled to each other at the center 1016 of the inductor 1000.

Figure 11:
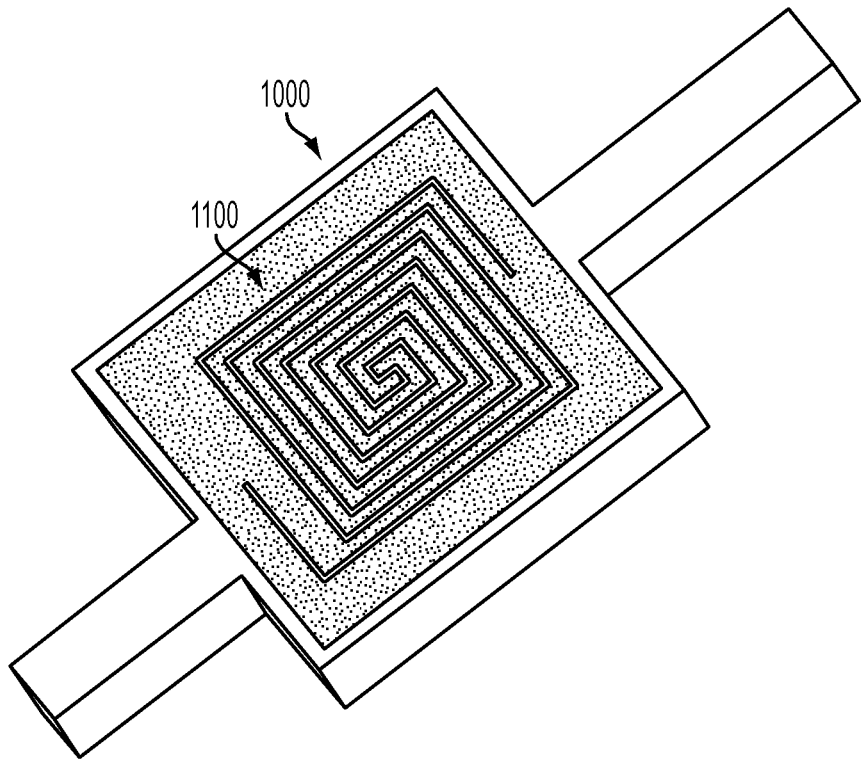

In some scenarios, a magnetic material 1100 is disposed between the windings of the inductor 1000 as shown in FIG. 11, as well as between the coil 1010 and the ground structure 1012 of the transition portion 1008. The magnetic material includes, but is not limited to, cobalt, platinum, iron, and/or any other ferrite-based material. The magnetic material 1100 increases the inductance value of the inductor 1000. For example, if the magnetic material comprises an iron based material, then the inductance value of the inductor 1000 is increased from 1 nH to 62 nH.

During fabrication, the magnetic material 1100 is added: (a) after the inductor 1000 structure is fabricated and at least one resist layer is removed; or (b) via an interleaving process in which layers of the inductor 1000 and layers of magnetic material 1100 are alternatively built-up.

Figure 12:
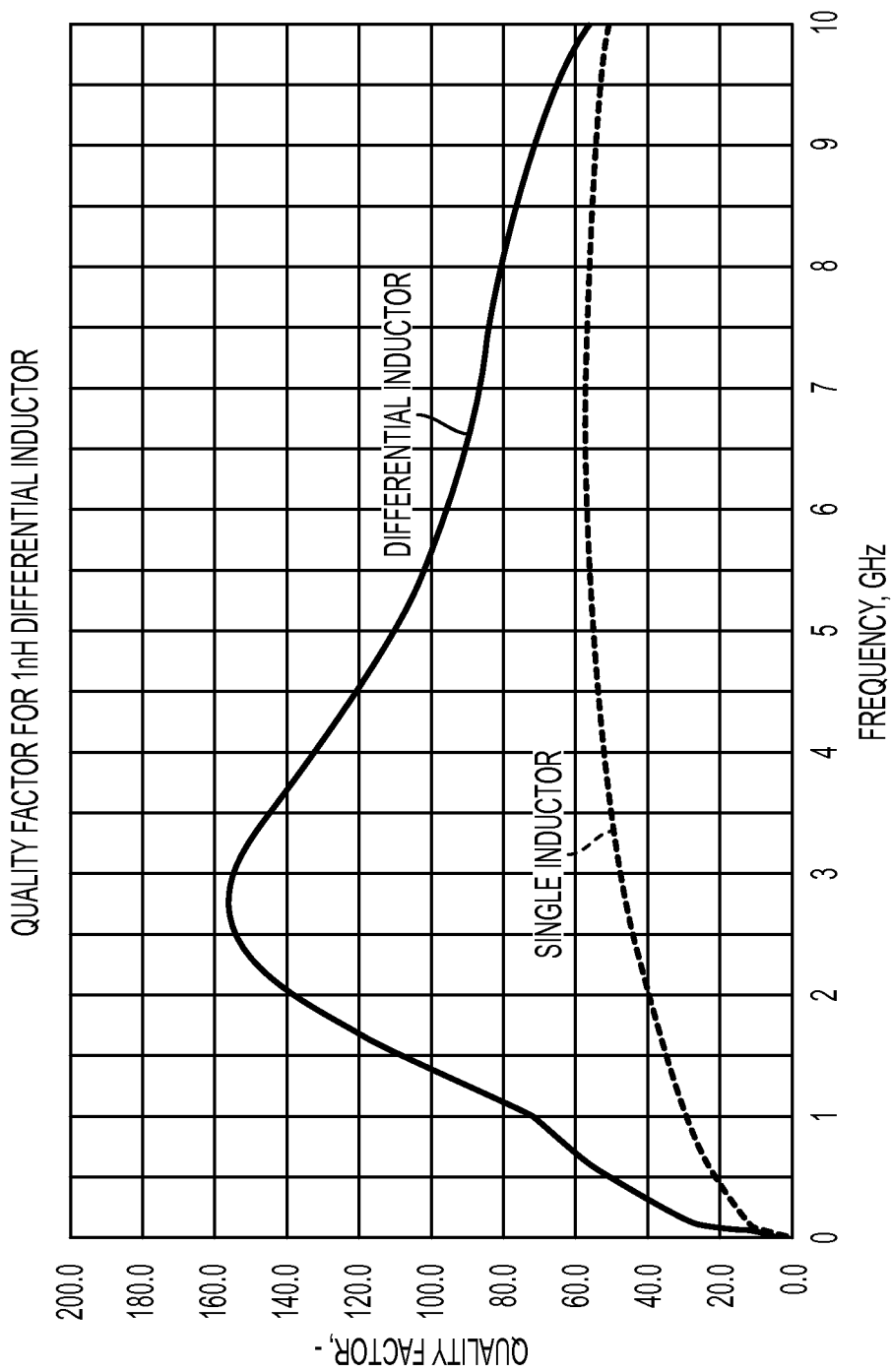
FIG. 12 is a graph illustrating quality factors for two inductors.

Referring now to FIG. 12, there is provided a graph illustrating Q factors for the two types of inductors of the present invention, namely an inductor 114 of FIG. 1 and differential inductor 1000 without the magnetic material 1100. As evident from FIG. 12, the Q factor of the differential inductor 1000 is significantly higher than the Q factor for the inductor 114 of FIG. 1 of the same size using the same fabrication technology. Still, the Q factors of both inductors 114, 1000 are much higher than that of conventional inductors which are formed directly on a substrate. As should be understood, the Q factor is critical for providing an RF filter with a good rejection ratio.

Figure 13:
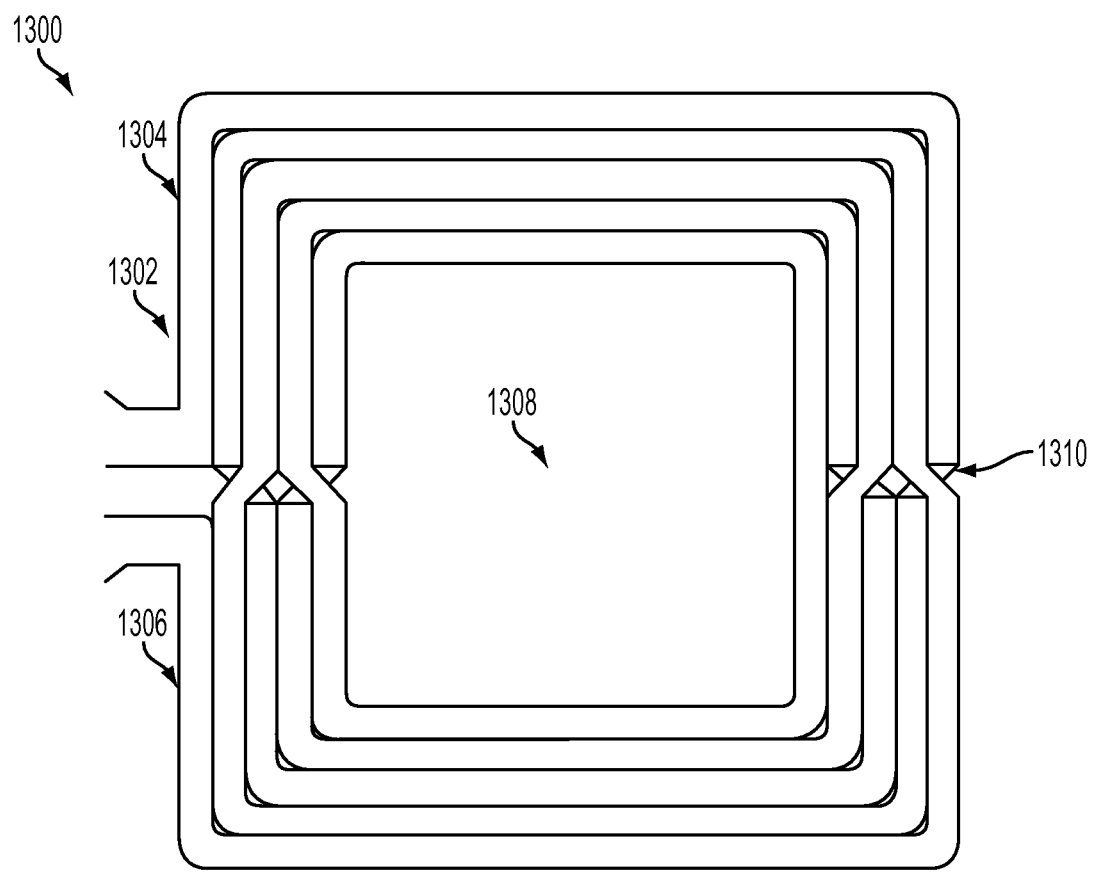
FIG. 13 is a schematic illustration of an exemplary differential inductor that is useful for understanding the present invention.

Referring now to FIG. 13, there is provided a schematic illustration of another exemplary architecture for an inductor 1300 which can be used with the RF filter of the present invention. As shown in FIG. 13, the inductor 1300 includes a coil 1302 with a plurality of windings. Specifically, the coil 1302 comprises a first coil portion 1304 defined by windings traveling along a first serpentine path in a direction towards a center 1308 of the inductor 1300 and a second coil portion 1306 defined by windings traveling along a second serpentine path in a direction away from the center 1308 of the inductor 1300. At least a portion of each winding of the second coil portion 1306 is disposed between two adjacent windings of the first coil portion 1304. Also, the first and second portions 1304, 1306 have overlap or cross-over portions 1310. A dielectric gap (not shown in FIG. 13) is provided between respective overlap or cross-over portions 1310 of the first and second portions 1304, 1306. The dielectric gap provides an inductor with an increased Q factor as compared to conventional inductors in which overlap or cross-over portions are separated from each other by other dielectric materials (e.g., a dielectric substrate material).

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

I claim:

1. An integrated Microelectromechanical Systems ("MEMS") device, comprising:

a substrate;

a transition portion connected to and at least partially extending transversely away from a major surface of the substrate;

a differential inductor mechanically suspended above a major surface of the substrate at least partially by the transition portion and electrically connected to an electronic circuit external thereto by the transition portion; and a first dielectric gap between the major surface of the substrate and the differential inductor.

2. The integrated MEMS device according to claim 1, wherein the electronic circuit is formed on the major surface of the substrate so as to reside between the substrate and the differential inductor, wherein a dielectric gap exists between the electronic circuit and the differential inductor.

3. The integrated MEMS device according to claim 1, wherein a first conductive material used to fabricate the differential inductor has a first melting point that is different from second melting points of all second conductive materials used to form the electronic circuit by no more than 100° C.

4. The integrated MEMS device according to claim 1, wherein the transition portion comprises a three dimensional hollow ground structure in which an elongate center conductor is suspended.

5. The integrated MEMS device according to claim 4, wherein the elongated center conductor is separated from the three dimensional hollow ground structure via a dielectric gap on all sides.

6. The integrated MEMS device according to claim 4, wherein the differential inductor has a first inductor port electrically connected to the three dimensional hollow ground structure of the transition portion and a second inductor port electrically connected to the elongated center conductor of the transition portion.

7. The integrated MEMS device according to claim 4, wherein the differential inductor has a first inductor port and a second inductor port which are both electrically connected to the elongate center conductor of the transition portion.

8. The integrated MEMS device according to claim 1, wherein a periphery of the differential inductor is separated from and at least partially surrounded by a ground structure of the transition portion.

9. The integrated MEMS device according to claim 8, further comprising a magnetic material disposed between the differential inductor and the ground structure of the transition portion.

10. The integrated MEMS device according to claim 1, wherein the differential inductor comprises a first coil portion defined by windings traveling along a first serpentine path in a direction towards a center of the differential inductor and a second coil portion defined by windings traveling along a serpentine path in a direction away from the center of the differential inductor.

11. The integrated MEMS device according to claim 10, wherein the first coil portion and the second coil portion are electrically coupled to each other at the center of the differential inductor.

12. The integrated MEMS device according to claim 10, wherein at least a portion of each winding of the second coil portion is disposed between two adjacent windings of the second coil portion.

13. The integrated MEMS device according to claim 12, wherein at least a first winding portion of the first coil portion overlaps at least a second winding portion of the second coil portion such that a dielectric gap exists between the first and second winding portions.

14. The integrated MEMS device according to claim 1, further comprising a magnetic material disposed between coil windings of the differential inductor.

15. A method of making an integrated Microelectromechanical Systems ("MEMS") device, comprising:
- forming an electronic circuit on a major surface of a substrate using a first conductive material having a first melting point;
- forming a differential inductor structure on the major surface of the substrate using a second conductive material having a second melting point; and
- removing at least one first resist layer from the MEMS filter structure to form (a) a differential inductor suspended over the major surface of the substrate at least partially by a transition portion electrically connecting the differential inductor to an electronic circuit, and (b) a first dielectric gap between the major surface of the substrate and the differential inductor.

16. The method according to claim 15, wherein the electronic circuit is formed on the major surface of the substrate so as to reside between the substrate and the differential inductor, and wherein a dielectric gap exists between the electronic circuit and the differential inductor.

17. The method according to claim 15, wherein the first and second melting points are different by no more than 100° C.

18. The method according to claim 15, further comprising removing at least one second resist layer from the differential inductor structure such that the transition portion is defined by a three dimensional hollow ground structure in which an elongated center conductor is suspended.

19. The method according to claim 18, wherein the elongated center conductor is separated from the three dimensional hollow ground structure via a dielectric gap on all sides.

20. The method according to claim 18, further comprising electrically connecting a first inductor port of the differential inductor to the three dimensional hollow ground structure of the transition portion and electrically connecting a second inductor of the differential inductor to the elongate center conductor of the transition portion.

21. The method according to claim 18, further comprising electrically connecting a first inductor port and a second inductor port of the differential inductor to the elongate center conductor of the transition portion.

22. The method according to claim 15, further comprising surrounding at least a portion of a periphery of the differential inductor by a ground structure of the transition portion.

23. The method according to claim 22, further comprising disposing a magnetic material between the differential inductor and the ground structure of the transition portion.

24. The method according to claim 15, wherein the differential inductor comprises a first coil portion defined by windings traveling along a first serpentine path in a direction towards a center of the differential inductor and a second coil portion defined by windings traveling along a serpentine path in a direction away from the center of the differential inductor.

25. The method according to claim 24, wherein the first coil portion and the second coil portion are electrically coupled to each other at the center of the differential inductor.

26. The method according to claim 24, wherein at least a portion of each winding of the second coil portion is disposed between two adjacent windings of the second coil portion.

27. The method according to claim 26, wherein at least a first winding portion of the first coil portion overlaps at least a second winding portion of the second coil portion such that a dielectric gap exists between the first and second winding portions.

28. The method according to claim 15, further comprising disposing a magnetic material between coil windings of the differential inductor.

* * * * *